US009747161B2

United States Patent
Musha et al.

(10) Patent No.: US 9,747,161 B2
(45) Date of Patent: Aug. 29, 2017

(54) SIGNAL PROCESSING DEVICE, MAGNETIC INFORMATION PLAYBACK DEVICE, AND SIGNAL PROCESSING METHOD

(71) Applicant: FUJIFILM CORPORATION, Minato-ku, Tokyo (JP)

(72) Inventors: Atsushi Musha, Kanagawa (JP); Osamu Shimizu, Kanagawa (JP)

(73) Assignee: FUJIFILM CORPORATION, Tokyo (JP)

(*) Notice: Subject to any disclaimer, the term of this patent is extended or adjusted under 35 U.S.C. 154(b) by 0 days.

(21) Appl. No.: 14/923,441

(22) Filed: Oct. 27, 2015

(65) Prior Publication Data

US 2016/0124811 A1    May 5, 2016

(30) Foreign Application Priority Data

Oct. 30, 2014  (JP) .................................. 2014-221972
Jul. 16, 2015  (JP) .................................. 2015-142325

(51) Int. Cl.
*H03M 13/03*     (2006.01)
*G06F 11/10*     (2006.01)
(Continued)

(52) U.S. Cl.
CPC .... *G06F 11/1076* (2013.01); *G11B 20/10009* (2013.01); *G11B 20/10222* (2013.01);
(Continued)

(58) Field of Classification Search
CPC ........ G11B 20/10222; G11B 20/10268; G11B 20/10009; G11B 5/00821; G11B 5/012;
(Continued)

(56) References Cited

U.S. PATENT DOCUMENTS 5,341,249 A * 8/1994 Abbott ................... G11B 20/10
360/39
5,781,699 A * 7/1998 Dittmar ................... G06F 3/061
706/13
(Continued)

FOREIGN PATENT DOCUMENTS

JP    H07-123358 A    5/1995
JP    2006-127679 A   5/2006

OTHER PUBLICATIONS

Xie, Jin; Kumar, B. V. K. V. "Timing Recovery Loop Delay Compensation by Optimal Loop Gains", In: Communications, 2006. ICC '06. IEEE International Conference on. IEEE, 2006. p. 3229-3234.
(Continued)

*Primary Examiner* — Guerrier Merant
(74) *Attorney, Agent, or Firm* — SOLARIS Intellectual Property Group, PLLC

(57) ABSTRACT

The invention provides a signal processing device, including: an extraction section that extracts, from an input digital signal, a decoding target signal at an extraction timing that has been determined as a timing for extracting the decoding target signal; a decoding section that decodes the decoding target signal by estimating, by a maximum likelihood decoding, a candidate for a decoding result of the decoding target signal extracted by the extraction section and detecting a maximum likelihood decoding result; and an adjustment section that adjusts the extraction timing using a likelihood of the candidate for the decoding result estimated by the decoding section.

14 Claims, 14 Drawing Sheets

(51) Int. Cl.
 *G11B 20/10* (2006.01)
 *H03M 13/00* (2006.01)
 *G11B 5/008* (2006.01)
 *G11B 5/012* (2006.01)

(52) U.S. Cl.
 CPC ... *G11B 20/10268* (2013.01); *H03M 13/6325* (2013.01); *H03M 13/6331* (2013.01); *H03M 13/6343* (2013.01); *G11B 5/00821* (2013.01); *G11B 5/012* (2013.01)

(58) Field of Classification Search
 CPC ........ G11B 20/10055; G11B 20/10481; G11B 27/36; H03M 13/6343; H03M 13/6325; H03M 13/6331; G06F 11/1076; G06F 3/061; G06F 3/0626; G06F 3/0634; G06F 3/0677; G06N 3/126
 See application file for complete search history.

(56) References Cited

U.S. PATENT DOCUMENTS

| | | | |
|---|---|---|---|
| 7,370,266 B2* | 5/2008 | Yamakawa | G11B 20/10009 375/262 |
| 7,602,863 B2 | 10/2009 | Kovintavewat et al. | |
| 7,885,030 B2 | 2/2011 | Eleftheriou et al. | |
| 8,161,361 B1* | 4/2012 | Song | G11B 20/10527 360/67 |
| 2002/0008928 A1* | 1/2002 | Takahashi | G11B 20/10203 360/53 |
| 2002/0012308 A1* | 1/2002 | Tonami | G11B 20/10009 369/59.22 |
| 2003/0152175 A1* | 8/2003 | Kuki | G11B 20/10055 375/350 |
| 2006/0002689 A1 | 1/2006 | Yang et al. | |
| 2006/0026494 A1* | 2/2006 | Varma | H03M 13/6331 714/795 |
| 2006/0092803 A1* | 5/2006 | Tatsuzawa | G11B 20/10009 369/59.22 |
| 2006/0174180 A1* | 8/2006 | Vityaev | H03M 13/41 714/776 |
| 2006/0174183 A1* | 8/2006 | Ashley | H03M 13/395 714/792 |
| 2006/0193307 A1* | 8/2006 | Tomita | G11B 20/10 370/350 |
| 2007/0025224 A1* | 2/2007 | Tatsuzawa | G11B 20/10009 369/59.22 |
| 2007/0097822 A1* | 5/2007 | Iwanaga | G11B 7/094 369/53.2 |
| 2007/0140088 A1* | 6/2007 | Hino | G11B 20/10009 369/59.22 |
| 2008/0008233 A1* | 1/2008 | Cohen | H04L 25/0212 375/232 |
| 2008/0019249 A1* | 1/2008 | Tatsuzawa | G11B 20/10009 369/59.22 |
| 2010/0054716 A1* | 3/2010 | Honma | G11B 20/10009 386/334 |
| 2013/0083873 A1* | 4/2013 | Ishihara | H03M 13/4107 375/341 |
| 2013/0250744 A1* | 9/2013 | Higashino | G11B 7/0045 369/47.17 |

OTHER PUBLICATIONS

English language translation of the following: Office action dated Jul. 4, 2017 from the JPO in a Japanese patent application No. 2015-142325 corresponding to the instant patent application. This office action translation is submitted now in order to supplement the understanding of the cited references which are being disclosed in the instant Information Disclosure Statement.

* cited by examiner

SIGNAL PROCESSING DEVICE, MAGNETIC INFORMATION PLAYBACK DEVICE, AND SIGNAL PROCESSING METHOD

CROSS-REFERENCE TO RELATED APPLICATION

This application claims priority under 35 USC 119 from Japanese Patent Application No. 2014-221972 filed Oct. 30, 2014, and Japanese Patent Application No. 2015-142325 filed Jul. 16, 2015, the disclosures of which are incorporated by reference herein.

BACKGROUND

Technical Field

The technique of the present disclosure relates to a signal processing device, a magnetic information playback device, and a signal processing method.

Related Art

U.S. Pat. No. 7,602,863 B2 discloses a technique whereby the phase of a signal that is input at the input stage of a phase adjustment circuit is adjusted by feeding back the output of a decoder to the input stage of the phase adjustment circuit. Further, in the technique described in U.S. Pat. No. 7,602,863 B2, optimal feedback corresponding to a decoded pattern is enabled by installing an independent phase adjustment circuit for each possible decoding pattern.

In J. Xie and B. V. K. V. Kumar, "Timing Recovery Loop Delay Compensation by Optimal Loop Gains", in Proc. ICC, 2006, pp. 3229-3234 (referred to below as "the non-patent document"), a technique is described in which, even in a system in which delays exist in feedback to the input stage of a phase adjustment circuit, feedback delays can be suppressed to a minimum by optimizing the gain parameters of the phase adjustment circuit.

U.S. Pat. No. 7,885,030 B2 discloses a method that, because plural channels in a tape system are simultaneously influenced by speed fluctuations, improves resistance to jitter by using information on speed fluctuations obtained from the playback signals of other channels rather than only from the signal from a single channel.

However, in the technique described in U.S. Pat. No. 7,602,863 B2, since the final output of the decoder is fed back, it is difficult to immediately adjust the phase of a signal that is input at the input stage of the phase adjustment circuit. While it is possible to suppress reductions in immediacy by installing plural phase adjustment circuits and plural buffer memories, the scale of the circuit becomes enormous.

Further, in the technique described in the non-patent document, since the reliability of the signal that is fed back to the input stage of the phase adjustment circuit is low, the phase adjustment circuit becomes unable to function properly.

SUMMARY

The technique of the present disclosure provides a signal processing device, a magnetic information playback device, and a signal processing method that are able to balance high precision extraction of a specific decoding target signal with suppression of delays that occur in order to adjust the extraction timing, as compared to a case in which decoding target signal itself is used in the adjustment of the extraction timing and a case in which the final decoding result is used in the adjustment of the extraction timing.

A signal processing device according to a first aspect of the technique of the present disclosure includes: an extraction section that extracts, from an input digital signal, a decoding target signal at an extraction timing that has been determined as a timing for extracting the decoding target signal; a decoding section that decodes the decoding target signal by estimating, by a maximum likelihood decoding, a candidate for a decoding result of the decoding target signal extracted by the extraction section and detecting a maximum likelihood decoding result; and an adjustment section that adjusts the extraction timing using a likelihood of the candidate for the decoding result estimated by the decoding section. As a result, the signal processing device is able to balance high precision extraction of a specific decoding target signal with suppression of delays that occur in order to adjust the extraction timing, as compared to a case in which the decoding target signal itself is used in the adjustment of the extraction timing and a case in which the final decoding result is used in the adjustment of the extraction timing.

In the signal processing device according to a second aspect of the technique of the present disclosure, the decoding section includes a detection section that estimates the candidate by the maximum likelihood decoding and detects the maximum likelihood decoding result; and a correction section that corrects errors in the maximum likelihood decoding result detected by the detection section. As a result, the signal processing device is able to suppress delays that occur in order to adjust the extraction timing, as compared to a case in which the extraction timing is adjusted based on the output of the correction section.

In the signal processing device according to a third aspect of the technique of the present disclosure, adjustment of the extraction timing by the adjustment section is initiated on a condition that a predetermined time, which is an upper limit time in which deviations in the extraction timing are permissible, has elapsed from initiation of extraction of the decoding target signal by the extraction section. As a result, the signal processing device can increase the reliability of the extraction timing, as compared to a case in which adjustment of the extraction timing is performed before a predetermined time, which is an upper limit time in which deviations in the extraction timing are permissible, has elapsed from initiation of extraction of the decoding target signal.

In the signal processing device according to a fourth aspect of the technique of the present disclosure, after the predetermined time has elapsed from initiation of extraction of the decoding target signal by the extraction section, the adjustment section calculates the likelihood based on the extracted decoding target signal each time the decoding target signal is extracted by the extraction section, and adjusts the extraction timing using the calculated likelihood each time the likelihood is calculated. As a result, the signal processing device can secure high reliability with respect to the extraction timing even when the decoding target signal has fluctuated, as compared to a case in which, after the predetermined time has elapsed from initiation of extraction of the decoding target signal, adjustment of the extraction timing is performed only once using the first calculated likelihood.

In the signal processing device according to a fifth aspect of the technique of the present disclosure, the adjustment section calculates the likelihood based on the extracted decoding target signal each time the decoding target signal is extracted by the extraction section, and adjusts the extraction timing using the calculated likelihood each time the likelihood is calculated. As a result, the signal processing device can suppress reductions in the accuracy of adjustment of the extraction timing accompanying fluctuations in the decoding target signal, as compared to a case in which adjustment of the extraction timing is performed only once using the likelihood.

In the signal processing device according to a sixth aspect of the technique of the present disclosure, irrespective of whether or not a maximum likelihood decoding result has been detected by the decoding section, the adjustment section calculates the likelihood based on the extracted decoding target signal each time the decoding target signal is extracted by the extraction section, and adjusts the extraction timing using the calculated likelihood each time the likelihood is calculated. As a result, the signal processing device can suppress delays that occur in order to adjust the extraction timing as compared to a case in which the extraction time is adjusted after waiting for the maximum likelihood to be detected.

In the signal processing device according to a seventh aspect of the technique of the present disclosure, the lower the likelihood, the more the adjustment section reduces an adjustment amount of the extraction timing. As a result, the signal processing device can increase the accuracy of adjustment of the extraction timing as compared to case in which the adjustment amount of the extraction timing is determined independently of the likelihood.

In the signal processing device according to an eighth aspect of the technique of the present disclosure, the likelihood is calculated using soft information generated based on the decoding target signal. As a result, the signal processing device can obtain a highly accurate likelihood as compared to a case in which the likelihood is defined without using soft information.

In the signal processing device according to a ninth aspect of the technique of the present disclosure, the soft information comprises a maximum likelihood path metric and a competing path metric; the likelihood is defined by a probability that the decoding result is accurately detected by the decoding section; and the probability is calculated using the maximum likelihood path metric and the competing path metric. As a result, the signal processing device can obtain a highly accurate likelihood as compared to a case in which the likelihood is only defined with the maximum likelihood path metric or the competing path metric.

In the signal processing device according to a tenth aspect of the technique of the present disclosure, the adjustment section adjusts the extraction timing using an adjustment amount $\tau_{k+1}$ that is obtained using the following Equation (1), Equation (2) and Equation (3), where k is a natural number; $\epsilon$ is a phase error between the decoding target signal and an ideal decoding target signal; y is a signal level of the decoding target signal; d is a signal level of the ideal decoding target signal; $\tau$ is an adjustment amount of the extraction timing; g is the probability; $\theta$ is a derivative term of an error in the extraction timing; and $\alpha$ and $\beta$ are adjustment items. As a result, the signal processing device can adjust the extraction timing with high accuracy as compared to a case in which the extraction timing is only adjusted with a phase error calculated using Equation (1).

$$\epsilon_k = y_k d_{k-1} - y_{k-1} d_k \quad \text{Equation (1):}$$

$$\theta_k = \theta_{k-1} + g_k \beta \epsilon_k \quad \text{Equation (2):}$$

$$\tau_{k+1} = \tau_k + g_k \alpha \epsilon_k + \theta_k \quad \text{Equation (3):}$$

In the signal processing device according to an eleventh aspect of the technique of the present disclosure, the maximum likelihood decoding is a maximum likelihood decoding according to a Viterbi algorithm. As a result, the signal processing device can obtain high cost-effectiveness as compared to a case in which a maximum likelihood decoding according to an algorithm other than the Viterbi algorithm is adopted.

The signal processing device according to a twelfth aspect of the technique of the present disclosure further includes an amplitude component adjustment section that adjusts an amplitude component of the decoding target signal, and the decoding section estimates, by the maximum likelihood decoding, the candidate for the decoding result of the decoding target signal, the amplitude component of which has been adjusted by the amplitude component adjustment section, and detects the maximum likelihood decoding result. As a result, the signal processing device can increase the accuracy of detection of the maximum likelihood decoding target signal by the decoding section, as compared to a case in which the decoding target signal extracted by the extraction section is directly input to the decoding section.

The magnetic information playback device according to a thirteenth aspect of the technique of the present disclosure includes: a reading head that reads magnetic information from a magnetic recording medium; a generation section that generates a digital signal from the magnetic information that has been read by the reading head; and the signal processing device according to the first aspect, to which the digital signal generated by the generating section is input. As a result, the magnetic information playback device is able to achieve both of high precision extraction of a specific decoding target signal and suppression of delays that occur in order to adjust the extraction timing, as compared to a case in which the decoding target signal itself is used in the adjustment of the extraction timing and a case in which the final decoding result is used in the adjustment of the extraction timing.

In the magnetic information playback device according to a fourteenth aspect of the technique of the present disclosure, the magnetic recording medium is a magnetic tape. As a result, the magnetic information playback device is able to achieve both of high precision extraction of a specific decoding target signal and suppression of delays that occur in order to adjust the extraction timing even in a case in which there are localized fluctuations in the conveyance speed of the magnetic tape, as compared to a case in which the decoding target signal itself is used in the adjustment of the extraction timing and a case in which the final decoding result is used in the adjustment of the extraction timing.

In the magnetic information playback device according to a fifteenth aspect of the technique of the present disclosure, adjustment of the extraction timing by the adjustment section included in the signal processing device is initiated on a condition that a predetermined time, which is a permissible time for jitter that occurs in conjunction with conveyance of the magnetic tape, has elapsed from initiation of extraction of the decoding target signal by the extraction section included in the signal processing device. As a result, the magnetic information playback device can increase the reliability of the extraction timing as compared to a case in which adjustment of the extraction timing is performed on the condition that extraction of the decoding target signal has been initiated.

A signal processing method according to a sixteenth aspect of the technique of the present disclosure includes: extracting, from an input digital signal, a decoding target signal at an extraction timing that has been determined as a timing for extracting the decoding target signal; decoding the decoding target signal by estimating, by a maximum likelihood decoding, a candidate for a decoding result of the extracted decoding target signal and detecting a maximum likelihood decoding result; and adjusting the extraction timing using a likelihood of the estimated candidate for the decoding result. As a result, the signal processing method is able to achieve both of high precision extraction of a specific decoding target signal and suppression of delays that occur in order to adjust the extraction timing, as compared to a case in which the decoding target signal itself is used in the adjustment of the extraction timing and a case in which the final decoding result is used in the adjustment of the extraction timing.

According to the technique of the present disclosure an effect can be obtained whereby it is possible to balance high precision extraction of a specific decoding target signal with suppression of delays that occur in order to adjust the extraction timing, as compared to a case in which the decoding target signal itself is used in the adjustment of the extraction timing and a case in which the final decoding result is used in the adjustment of the extraction timing.

BRIEF DESCRIPTION OF THE DRAWINGS

Exemplary embodiments will be described in detail based on the following figures, wherein.

DESCRIPTION OF EMBODIMENTS

In the following, an example of an embodiment of a magnetic information playback device according to the technique of the present disclosure is explained in accordance with the attached drawings.

Figure 1:
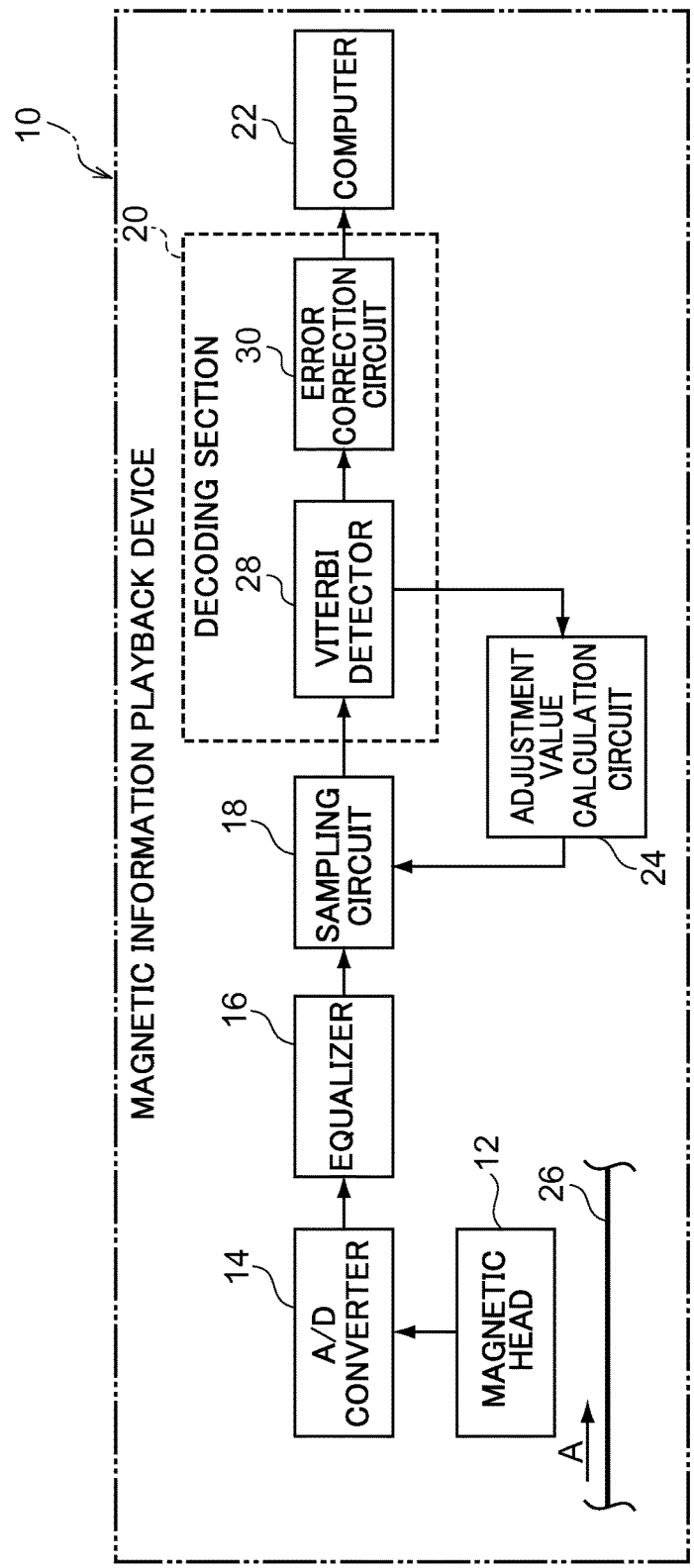
FIG. 1 is a block diagram showing an example of the main components of a magnetic information playback device according to an embodiment.

As shown in FIG. 1 as an example, magnetic information playback device 10 includes magnetic head 12, A/D (analog/digital) converter 14, equalizer 16, sampling circuit 18, decoding section 20, computer 22 and adjustment value calculation circuit 24.

Magnetic head 12 is an example of a reading head according to the technique of the present disclosure, and A/D converter 14 and equalizer 16 are examples of generation sections according to the technique of the present disclosure. Further, sampling circuit 18 is an example of an extraction section and an adjustment section according to the technique of the present disclosure, and adjustment value calculation circuit 24 is an example of an adjustment section according to the technique of the present disclosure.

Magnetic head 12 reads out magnetic information from magnetic tape 26 (which is an example of a magnetic recording medium according to the technique of the present disclosure) in a state in which magnetic tape 26 is conveyed in the direction of arrow A, and outputs an analog signal corresponding to the read-out magnetic information to A/D converter 14.

A/D converter 14 converts the analog signal input from magnetic head 12 into a digital signal at a specific cycle, and outputs the digital signal obtained by the conversion to equalizer 16. Here, in the present embodiment, the specific cycle refers, for example, to a cycle of 10 nanoseconds regulated by a system clock.

Equalizer 16 performs waveform equalization on time series data by implementing digital filtering with respect to the time series data, which is a time series digital signal input by A/D converter 14. That is, equalizer 16 shapes the time series data such that a decoding target signal, which is a digital signal that is subject to decoding at decoding section 20, is sampled by sampling circuit 18 and output to decoding section 20. Then, equalizer 16 outputs the digital signal included in the time series data obtained by waveform equalization to sampling circuit 18 at a specific cycle.

Sampling circuit 18 samples a decoding target signal, at a specific sampling cycle, from the digital signal input from equalizer 16, and outputs the decoding target signal to decoding section 20 at a specific output cycle. Here, the specific sampling cycle refers to a cycle that has been determined as a cycle that specifies an interval in which the decoding target signal exists among digital signals input from equalizer 16, and the specific output cycle refers to a cycle that has been synchronized with the specific sampling cycle.

The sampling timing, that is, the sampling time, for each decoding target signal by sampling circuit 18 is adjusted by sampling circuit 18 and by adjustment value calculation circuit 24. Adjustment of the sampling period is achieved by adjustment of the phase of the clock for sampling that regulates the specific sampling cycle.

Decoding section 20 estimates a candidate for a decoding result of the decoding target signal input from sampling circuit 18 by a maximum likelihood decoding and detects the maximum likelihood decoding result, and decodes the decoding target signal by correcting errors in the detected decoding results. Generally, the maximum likelihood decoding is also called the maximum likelihood decoding method.

Decoding section 20 includes Viterbi detector 28 and error correction circuit 30. Viterbi detector 28, which is an example of a detection section according to the technique of the present disclosure, estimates the candidate for the decoding result of the decoding target signal input from sampling circuit 18 by the maximum likelihood decoding using a Viterbi algorithm and detects the maximum likelihood decoding result.

Viterbi detector 28 detects the definitive maximum likelihood decoding result (the most plausible decoding result) by selecting a maximum likelihood path from detection paths that are plural paths that are branched by successively connecting basic paths together. The basic path refers to a series of predicted decoding results, that is, a fixed form route that has linked predicted results. The basic path is determined by different combinations for each provisional decoding target signal, which are ideal decoding target signals. The combinations refer to, for example, a set such as a basic path from the predicted decoding result $A_1$ to predicted decoding result $B_1$, a basic path from predicted decoding result $A_1$ to predicted decoding result $B_2$, a basic path from predicted decoding result $A_2$ to the predicted decoding result $B_1$, and a basic path from predicted decoding result $A_3$ to predicted decoding result $B_3$.

In the present embodiment, since combinations of basic paths of extended class-4 partial response (EPR4) transmission routes are employed, the signal level of the provisional decoding target signals is any of $-2$, $-1$, $0$, $+1$ or $+2$. The signal levels of the provisional decoding target signals are derived in accordance with a definition table (omitted from the drawings) in which correlations between the signal levels of the decoding target signals and the signal levels of the provisional decoding target signals are defined. That is, Viterbi detector 28, in a case in which a decoding target signal is input, generates a provisional decoding target signal corresponding to the input decoding target signal in accordance with the definition table. Then, Viterbi detector 28 selects a combination of basic paths corresponding to the generated provisional decoding target signals and constructs detection paths using the basic paths of the selected combination.

The maximum likelihood path is the path having the smallest path metric among the plural paths included in the detection paths. The path metric refers to a value that is the square of the difference between the signal level of the decoding target signal and the signal level of the provisional decoding target signal. The path metric is an example of soft information (an index indicating the probability of a determination) generated based on the decoding target signal, and is calculated for each of plural paths.

In a case in which the maximum likelihood path metric, which is the path metric of the maximum likelihood path, is in contention with the second most likely path metric, which is the path metric of the second most likely path, Viterbi detector 28 does not select the maximum likelihood path and awaits input of a decoding target signal. Then, Viterbi detector 28 further generates a provisional decoding target signal corresponding to the input decoding target signal, updates the detection paths by continuing the construction of the detection paths by connecting a basic path corresponding to the generated provisional decoding target signal to the existing detection paths, and procrastinates detection of the decoding result.

Viterbi detector 28 outputs, to error correction circuit 30, a Viterbi detection signal (for example, a binarized signal such as "001" or "011") indicating a decoding result established by selecting the maximum likelihood path. Further, Viterbi detector 28 outputs, to adjustment value calculation circuit 24, the decoding target signal input from sampling circuit 18, the provisional decoding target signal, and the path metric.

Error correction circuit 30, which is an example of a correction section according to the technique of the present disclosure, performs final decoding by correcting errors in the Viterbi detection signal input from Viterbi detector 28, and outputs, to computer 22, a final decoding signal indicating the final decoding result.

Figure 13:
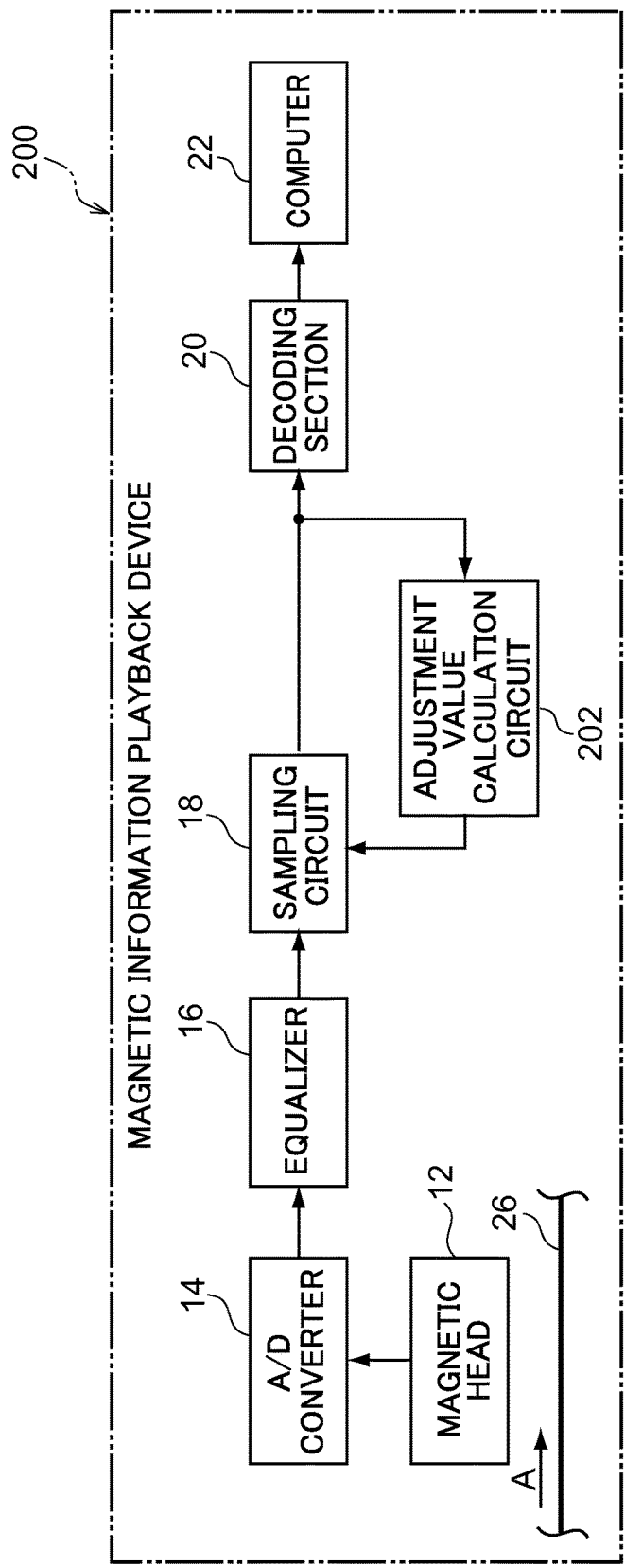
FIG. 13 is a block diagram showing an example of the main components of a magnetic information playback device according to a first conventional technique.

Incidentally, as shown in FIG. 13 as an example, magnetic information playback device 200 according to a first conventional technique has adjustment value calculation circuit 202. Adjustment value calculation circuit 202 calculates a time adjustment value based on a comparison result of the output from sampling circuit and a threshold value. Here, the time adjustment value refers to an adjustment value that is provided for adjustment of the time at which the decoding target signal is sampled. Sampling circuit 18 adjusts the time of the sampling in accordance with the time adjustment value calculated by adjustment value calculation circuit 202, and samples the digital signal at the adjusted timing. However, since the reliability of the output of sampling circuit 18 is low compared to the reliability of the output of decoding section 20, it is difficult to obtain accurate decoding results in a system in which the SNR is, for example, 12 decibels or less.

Figure 14:
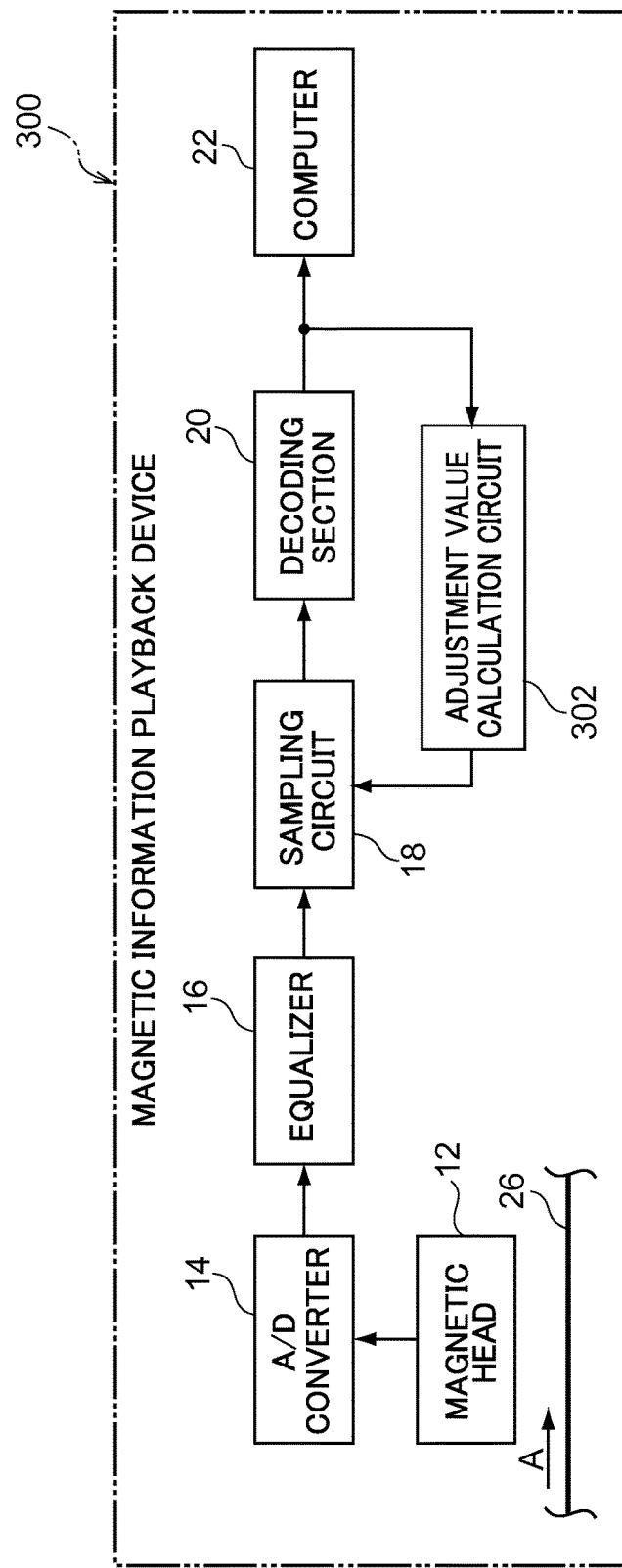
FIG. 14 is a block diagram showing an example of the main components of a magnetic information playback device according to a second conventional technique.

Further, as shown in FIG. 14 as an example, magnetic information playback device 300 according to a second conventional technique has adjustment value calculation circuit 302. Adjustment value calculation circuit 302 calculates a time adjustment value based on the final decoding result of decoding section 20; that is, based on the output of error correction circuit 30. Sampling circuit 18 adjusts the time of sampling in accordance with the time adjustment value calculated by adjustment value calculation circuit 302, and samples the digital signal at the adjusted timing. However, since several hundred bits of delays are generated before a final decoding result is obtained that relates to the decoding target signal sampled by sampling circuit 18, it is difficult to follow a comparatively fast jitter, and there is a risk that playback of magnetic information will fail. Further, jitter refers to a temporal deviation or fluctuation of a signal caused, for example, by stick-slip or drop-out.

Thus, in magnetic information playback device 10, adjustment value calculation circuit 24 calculates the likelihood of the candidate for the decoding result estimated by Viterbi detector 28 based on path metrics input from Viterbi detector 28, and calculates a time adjustment value using the calculated likelihoods. Then, adjustment value calculation circuit 24 outputs the calculated time adjustment value to sampling circuit 18, and sampling circuit 18 adjusts the time of sampling in accordance with the time adjustment value and samples the digital signal at the adjusted timing. The likelihood is calculated using soft information generated based on the decoding target signal.

Next, the mechanism of magnetic information playback device 10 is explained. In the following, for convenience of explanation, a case is explained in which a digital signal related to magnetic information recorded at magnetic tape 26 is input to sampling circuit 18 from equalizer 16 at a specific cycle.

First, the sampling processing executed by sampling circuit 18 during the period in which a digital signal is being input from equalizer 16 to sampling circuit 18 is explained with reference to FIG. 2.

Figure 2:
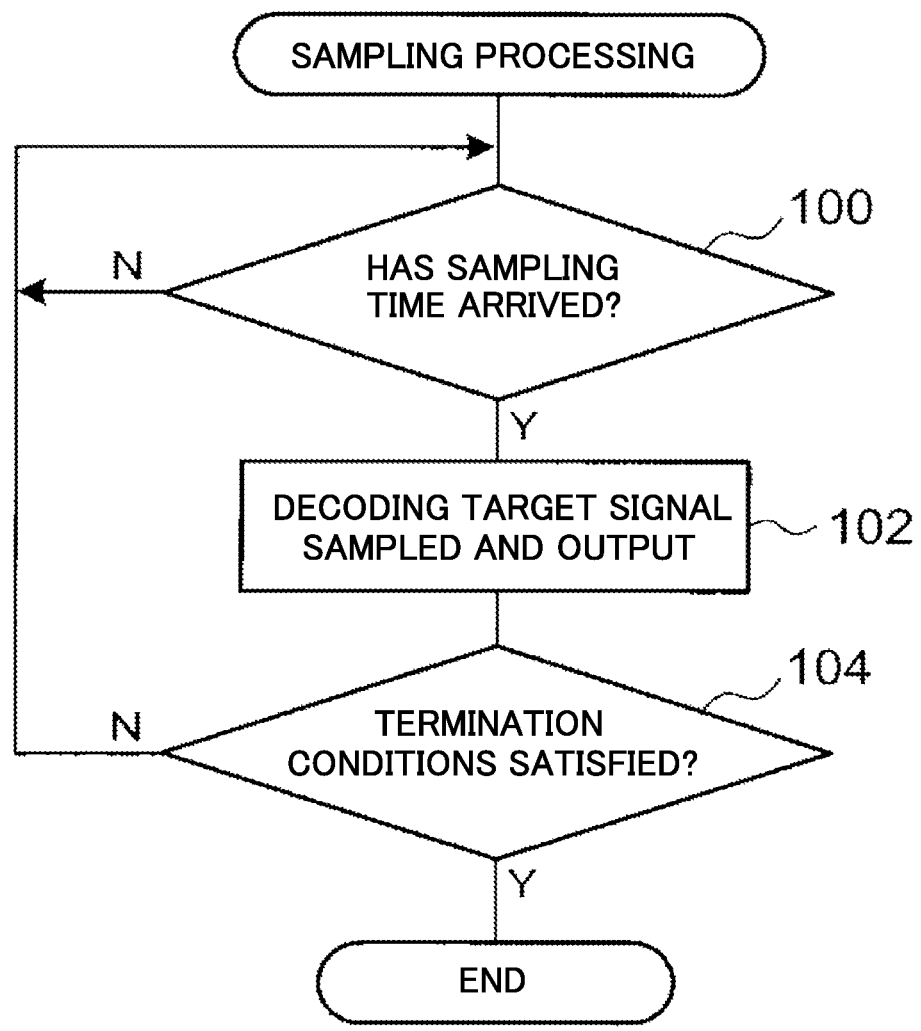
FIG. 2 is a flowchart showing an example of the flow of sampling processing according to an embodiment.

In the sampling processing shown in FIG. 2, first, in step 100, sampling circuit 18 waits until the sampling time arrives. When the sampling time arrives in step 100, the processing proceeds to step 102. The sampling time is adjusted in accordance with time adjustment value $\tau_{k+1}$, which is obtained by the sampling time adjustment processing that is described below being executed by adjustment value calculation circuit 24.

In step 102, sampling circuit 18 samples the decoding target signal and outputs it to Viterbi detector 28, after which the processing proceeds to step 104.

In step 104, sampling circuit 18 determines whether or not conditions for terminating the present sampling processing have been satisfied. One example of a condition for terminating the present sampling processing is a condition whereby a command signal, which commands shutdown of the operation of magnetic information playback device 10, has been input to sampling circuit 18. In step 104, in a case in which conditions for terminating the present sampling processing have not been satisfied, the determination is negative and the processing proceeds to step 100. In step 104, in a case in which conditions for terminating the present sampling processing have been satisfied, the determination is affirmative and the present sampling processing is terminated.

Next, the Viterbi detection processing executed by Viterbi detector 28 is explained with reference to FIG. 3.

Figure 3:
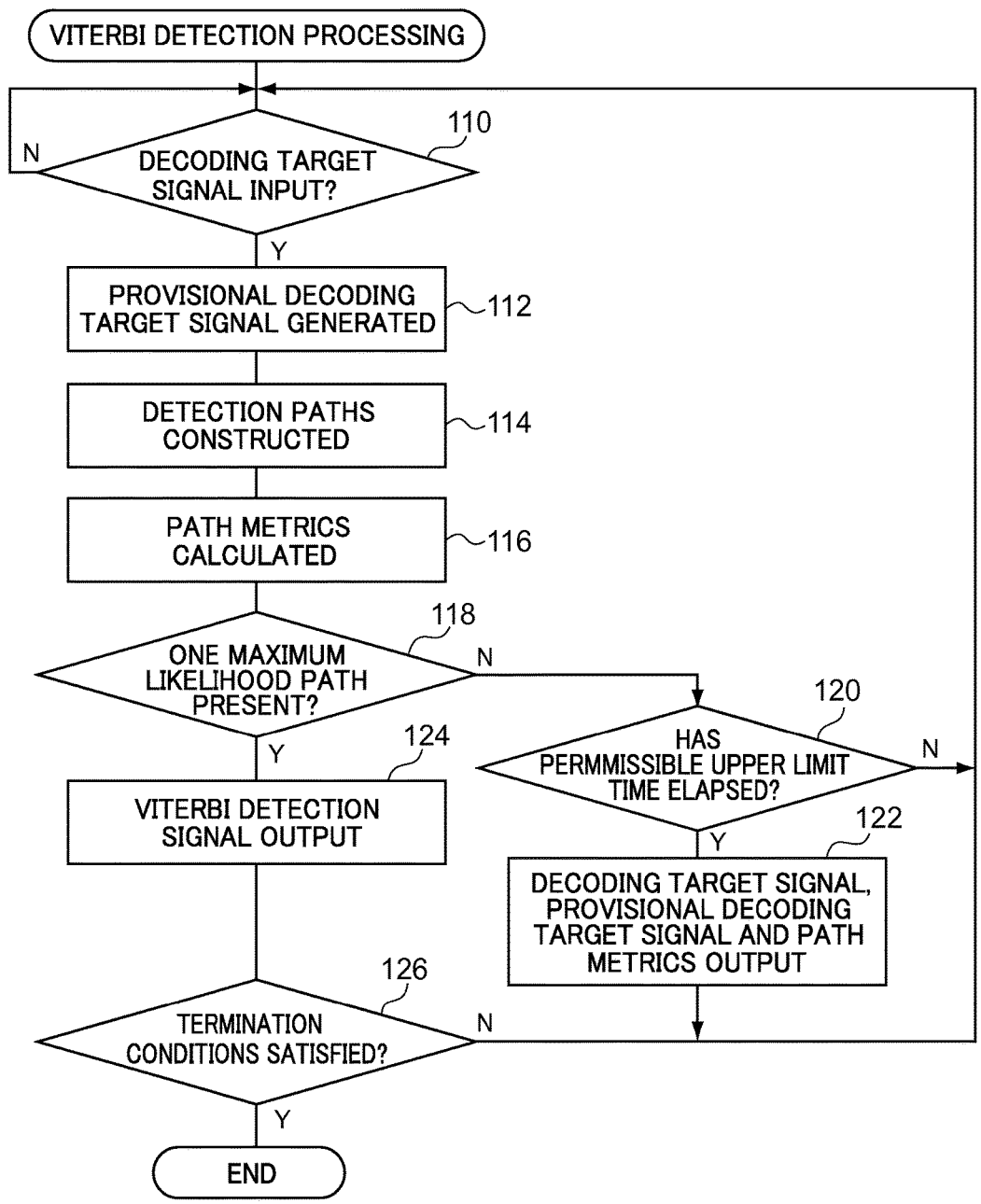
FIG. 3 is a flowchart showing an example of the flow of Viterbi detection processing according to an embodiment.

In the Viterbi detection processing shown in FIG. 3, first, in step 110, Viterbi detector 28 waits until the decoding target signal provided for the Viterbi detection is input from sampling circuit 18. When the decoding target signal is input in step 110, the processing proceeds to step 112.

In step 112, Viterbi detector 28 generates a provisional decoding target signal corresponding to the decoding target signal input in step 110, after which the processing proceeds to step 114.

In step 114, Viterbi detector 28 selects a combination of basic paths corresponding to the provisional decoding target signal generated in step 114 from combinations of basic paths of EPR4 transmission routes, and constructs detection paths using the basic paths of the selected combination, after which the processing proceeds to step 116.

In step 116, Viterbi detector 28 calculates path metrics for each of the plural paths included in the detection paths constructed in step 114, after which the processing proceeds to step 118.

In step 118, Viterbi detector 28 determines whether or not there is one maximum likelihood path present among paths that have currently been generated, with reference to the path metrics calculated in step 116. In step 118, in a case in which there is one maximum likelihood path present among paths that have currently been generated, the determination is affirmative and the processing proceeds to step 124. In step 118, in a case in which one maximum likelihood path is not present among paths that have currently been generated, the determination is negative and the processing proceeds to step 120.

In step 120, Viterbi detector 28 determines whether or not the elapsed time from the start of sampling by sampling circuit 18 to the present time has exceeded a permissible upper limit time. Here, a permissible upper limit time refers to an upper limit time in which time discrepancies in sampling by sampling circuit 18 are permitted. An example of an upper limit time is a time that is predetermined as a time in which jitter generated in conjunction with conveyance of magnetic tape 26 is permissible. In the present embodiment, since 6 bits are adopted as the delay bits corresponding to the upper limit time, in step 120, it is determined whether or not the delay bits from the start of sampling at sampling circuit 18 exceed 6 bits.

In step 120, in a case in which the elapsed time from the start of sampling by sampling circuit 18 to the present time has not exceeded a permissible upper limit time, the determination is negative and the processing proceeds to step 110. In step 120, in a case in which the elapsed time from the start of sampling by sampling circuit 18 to the present time has exceeded a permissible upper limit time, the determination is affirmative and the processing proceeds to step 122.

In step 122, Viterbi detector 28 outputs, to adjustment value calculation circuit 24, the decoding target signal input in step 110, the provisional decoding target signal generated in step 112, and the path metrics of each of the plural paths included in the detection paths, after which the processing proceeds to step 110.

In step 124, Viterbi detector 28 outputs, to error correction circuit 30, the Viterbi detection signal indicating the maximum likelihood decoding result established by selecting the one maximum likelihood path from the detection paths, after which the processing proceeds to step 126. At error correction circuit 30, error correction is performed with respect to the Viterbi detection signal input from Viterbi detector 28, and the signal obtained by correction is output to computer 22 as the final decoding signal.

In step 126, Viterbi detector 28 determines whether or not conditions for terminating the present Viterbi detection processing have been satisfied. One example of a condition for terminating the present Viterbi detection processing is a condition whereby a command signal, which commands shutdown of the operation of magnetic information playback device 10, has been input to decoding section 20.

In step 126, in a case in which conditions for terminating the present Viterbi detection processing have not been satisfied, the determination is negative and the processing proceeds to step 110. In step 104, in a case in which conditions for terminating the present Viterbi detection processing have been satisfied, the determination is affirmative and the present Viterbi detection processing is terminated.

Next, the sampling time adjustment processing executed by adjustment value calculation circuit 24 is explained with reference to FIG. 4.

Figure 4:
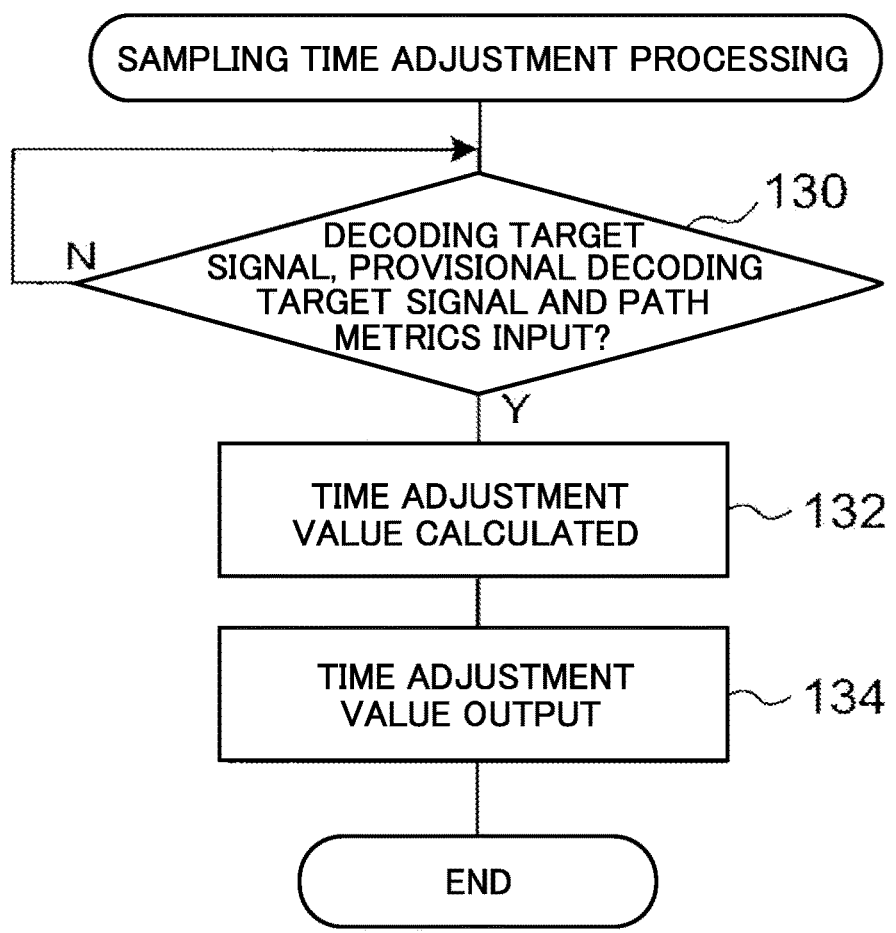
FIG. 4 is a flow chart showing an example of the flow of sampling time adjustment processing according to an embodiment.

In the sampling time adjustment processing shown in FIG. 4, first, in step 130, adjustment value calculation circuit 24 waits until the decoding target signal, the provisional decoding target signal, and the path metrics are input from Viterbi detector 28. In a case in which the decoding target signal, the provisional decoding target signal, and the path metrics are input from Viterbi detector 28 in step 130, the processing proceeds to step 132.

In step 132, adjustment value calculation circuit 24 calculates time adjustment value $\tau_{k+1}$ (being an example of an amount of adjustment of extraction timing according to the technique of the present disclosure) using Equation (1), Equation (2) and Equation (3) described below, after which the processing proceeds to step 134.

$$\epsilon_k = y_k d_{k-1} - y_{k-1} d_k \quad \text{Equation (1)}$$

$$\theta_k = \theta_{k-1} + g_k \beta \epsilon_k \quad \text{Equation (2)}$$

$$\tau_{k+1} = \tau_k + g_k \alpha \epsilon_k + \theta_k \quad \text{Equation (3)}$$

In Equation (1), Equation (2) and Equation (3), k is a natural number; $\epsilon$ is a phase error between the decoding target signal and the provisional decoding target signal, that is, a phase error between the input to Viterbi detector 28 and the output from Viterbi detector 28 to adjustment value calculation circuit 24; y is the signal level of the decoding target signal; d is the signal level of the provisional decoding target signal; $\tau$ is the time adjustment value; g is the probability that the decoding result is accurately detected by Viterbi detector 28 (in other words, the probability that the Viterbi detector 28 makes correct determinations); $\theta$ is the error in the time of sampling by sampling circuit 18 (frequency error (a derivative term from phase error)); and $\alpha$ and $\beta$ are adjustment items (fixed values).

Further, probability $g_k$ in Equation (2) and Equation (3) is a probability that defines the likelihood of the decoding result estimated by decoding section 20, and is defined by the function shown by the following Equation (4).

Equation (4)

$$g_k \equiv \frac{e^{-M^1_k}}{e^{-M^1_k} + e^{-M^2_k}} \quad (4)$$

In Equation (4), $M^1$ is the maximum likelihood path metric and $M^2$ is the second most likely path metric. This means that probability $g_k$ indicated by Equation (4) fluctuates in accordance with soft information obtained from the separate paths of the maximum likelihood path metric and the second most likely path metric, and means that the likelihood increases as the value of probability $g_k$ increases. Here, a case is exemplified in which the probability is calculated using the maximum likelihood path metric and the second most likely path metric; however, the technique of the present disclosure is not limited thereto. For example, a probability may be calculated that further considers the path metrics of plausible paths from the third most likely onward, and the probability may be calculated, using a competing path metric, for selecting the maximum likelihood path, that competes with the maximum likelihood path metric, and using the maximum likelihood path metric.

Further, probability $g_k$ in Equation (2) and Equation (3) may be defined by the following Equation (5).

Equation (5)

$$g_k \equiv \frac{2e^{-M^1_k}}{e^{-M^1_k} + e^{-M^2_k}} - 1 \quad (5)$$

However, in a case in which $g_k \equiv \frac{e^{-M^1_k}}{e^{-M^1_k} + e^{-M^2_k}} \geq 0.6$, $g_k = 1$ and in a case in which $g_k \equiv \frac{e^{-M^1_k}}{e^{-M^1_k} + e^{-M^2_k}} \leq 0.6$, $g_k = 0$ In addition, probability $g_k$ in Equation (2) and Equation (3) may be defined by the following Equation (6). While only the second most likely path metric $M^2$ is considered as the path metric of the specific competing path in Equation (4) and Equation (5), all the competing paths $M^i$ are considered in Equation (6).

Equation (6)

$$g_k \equiv \frac{e^{-M^1_k}}{\sum_i e^{-M^i_k}} \quad (6)$$

In step 134, adjustment value calculation circuit 24 outputs, to sampling circuit 18, the time adjustment value calculated in step 132, after which the present sampling time adjustment processing is terminated.

In this way, when the time adjustment value is output to sampling circuit 18, sampling circuit 18 adjusts the time of sampling in accordance with the set time adjustment value and samples the digital signal at the adjusted time of sampling.

The adjustment of the time of sampling is realized, for example, by adjusting the result of a non-linear interpolation such as a Nyquist interpolation with the time adjustment value; however, the technique of the present disclosure is not limited thereto. The adjustment of the time of sampling may, for example, be realized by adjusting the result of a linear interpolation between digital signals having adjacent input times from equalizer 16 with the time adjustment value. In this case, digital signals are input to sampling circuit 18 at an interval of 10 nanoseconds, for example, and when the time adjustment value is 5 nanoseconds, the time of sampling is adjusted such that sampling is performed at a time that corresponds to a center point between digital signal $x_k$ and digital signal $x_{k+1}$.

Figure 5:
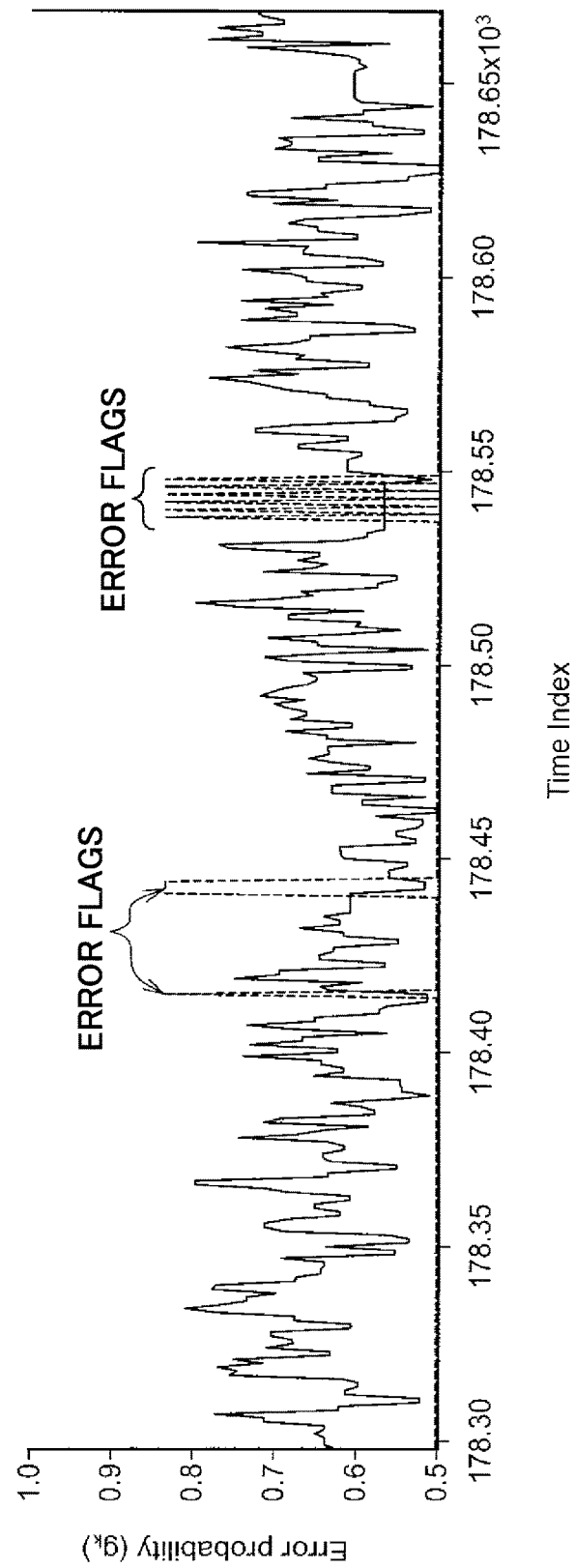
FIG. 5 is a graph showing an example of a correlation between probability $g_k$ and an error occurrence location.

Here, as shown in FIG. 5 as an example, probability $g_k$ tends to decrease at error occurrence locations (locations at which the error flags are standing in the example shown in FIG. 5). As a result, in magnetic information playback device 10, by adjusting the time of sampling in accordance with time adjustment value $\tau_{k+1}$, which fluctuates in response to probability $g_k$, even if the read-out results at magnetic head 12 vary from moment to moment, decoding target results that follow these variations are sampled.

In FIGS. 6 to 10, comparative examples are shown, in a comparatively low system in which the SNR is from 12 decibels to 12.5 decibels, in a case in which the time of sampling is adjusted by delaying by only the extent of 6 bits, which is the permissible upper limit for delay from the viewpoint of jitter trackability.

Figure 6:
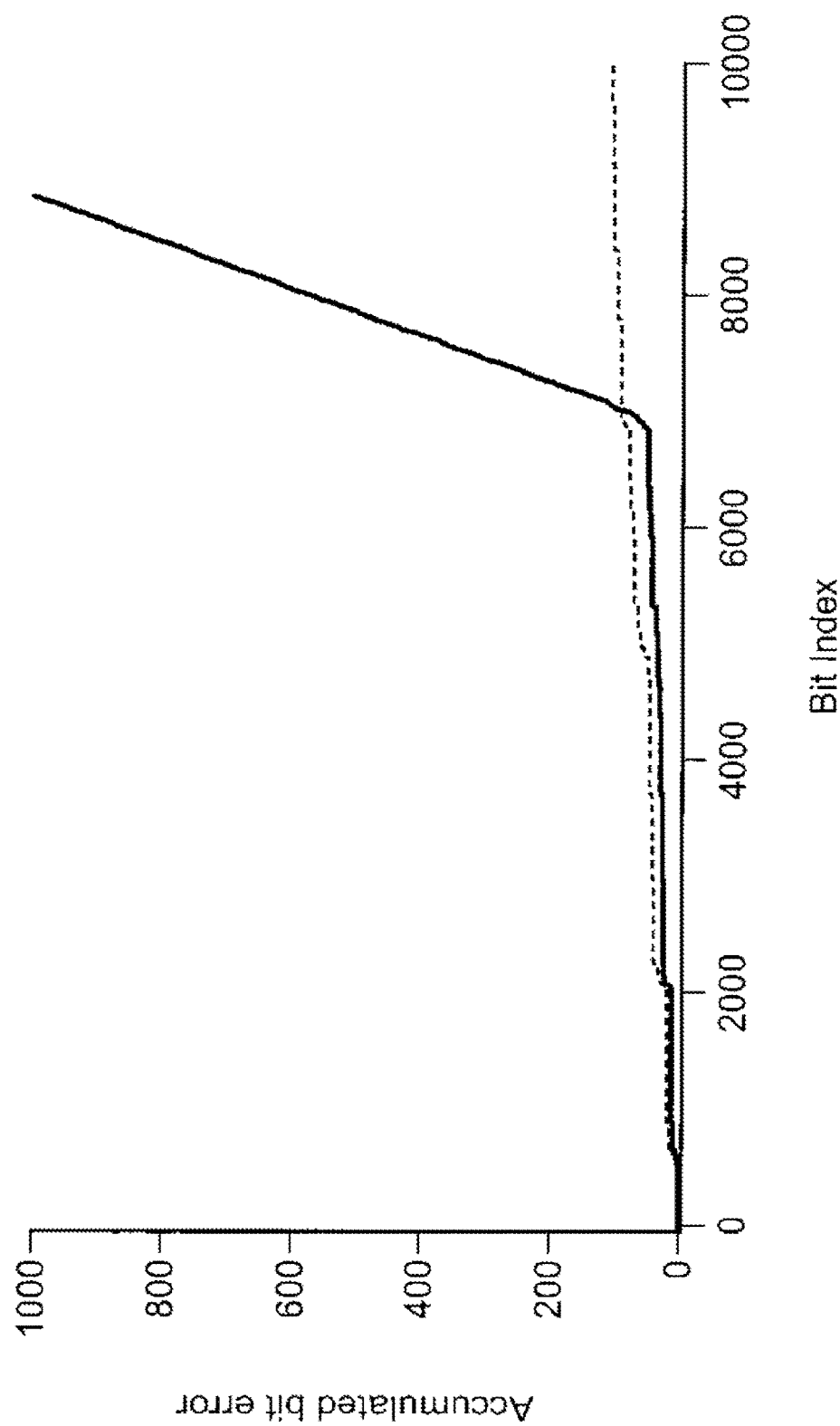
FIG. 6 is a graph showing an example of total number of error bits against processed data length when probability $g_k$ indicated by Equation (4) is used (broken line), and of total number of error bits against processed data length when probability $g_k$ is a fixed value (solid line)

FIG. 6 shows an example of total number (broken line) of error bits against processed data length in a case in which probability $g_k$ indicated by Equation (4) is used, and of total number (solid line) of error bits against processed data length when probability $g_k$ is a fixed value (here, as an example, "1"). In the example shown in FIG. 6, the total number of error bits against processed data length in a case in which probability $g_k$ is a fixed value sharply increases at a certain processed data length, while the total number of error bits against processed data length in a case in which probability $g_k$ indicated by Equation (4) is used does not show any sharp increase.

Figure 7:
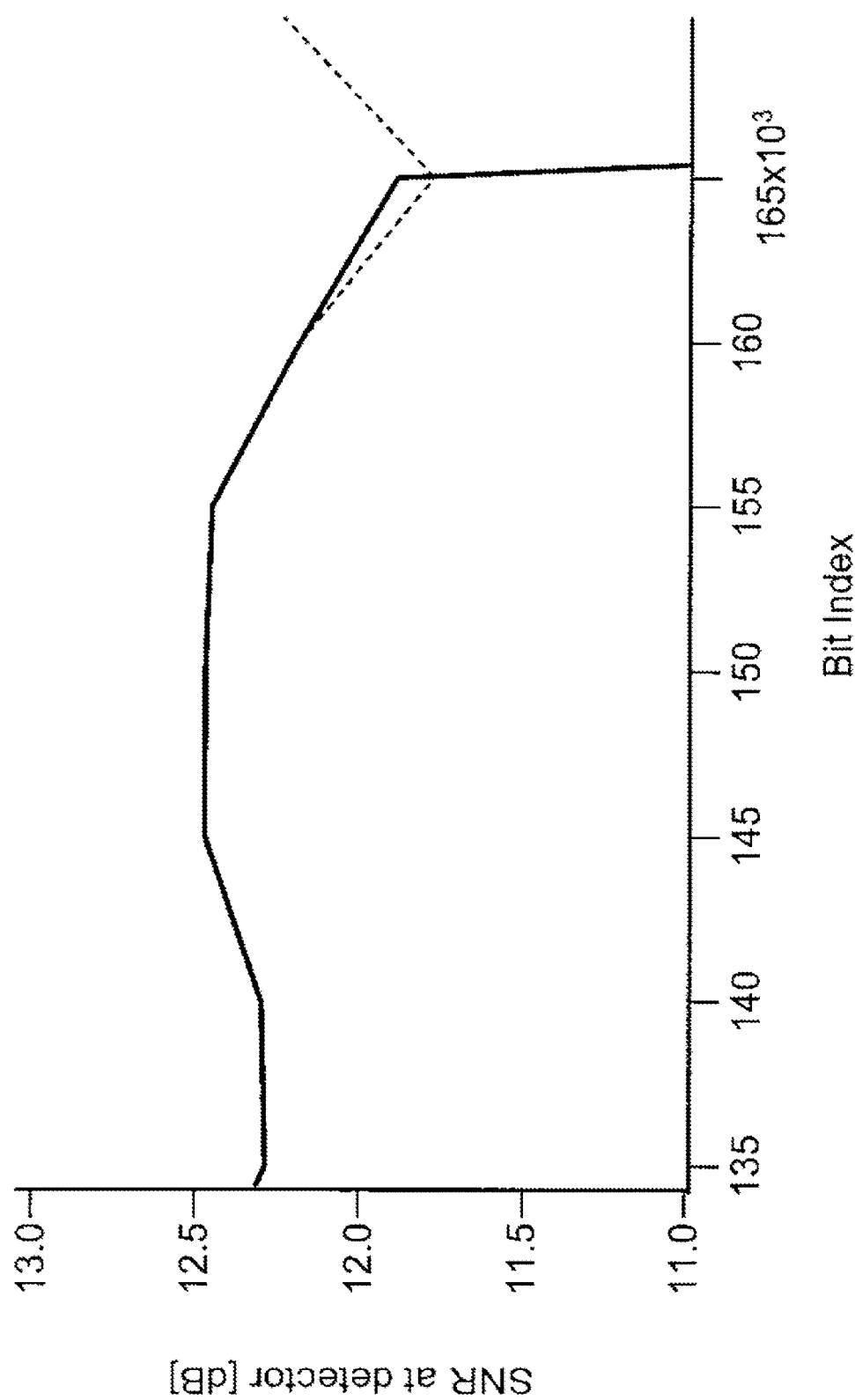
FIG. 7 is a graph showing an example of signal-noise ratio (SNR) against processed data length when probability $g_k$ indicated by Equation (4) is used (broken line), and of SNR against processed data length when probability $g_k$ is a fixed value (solid line)
Figure 9:
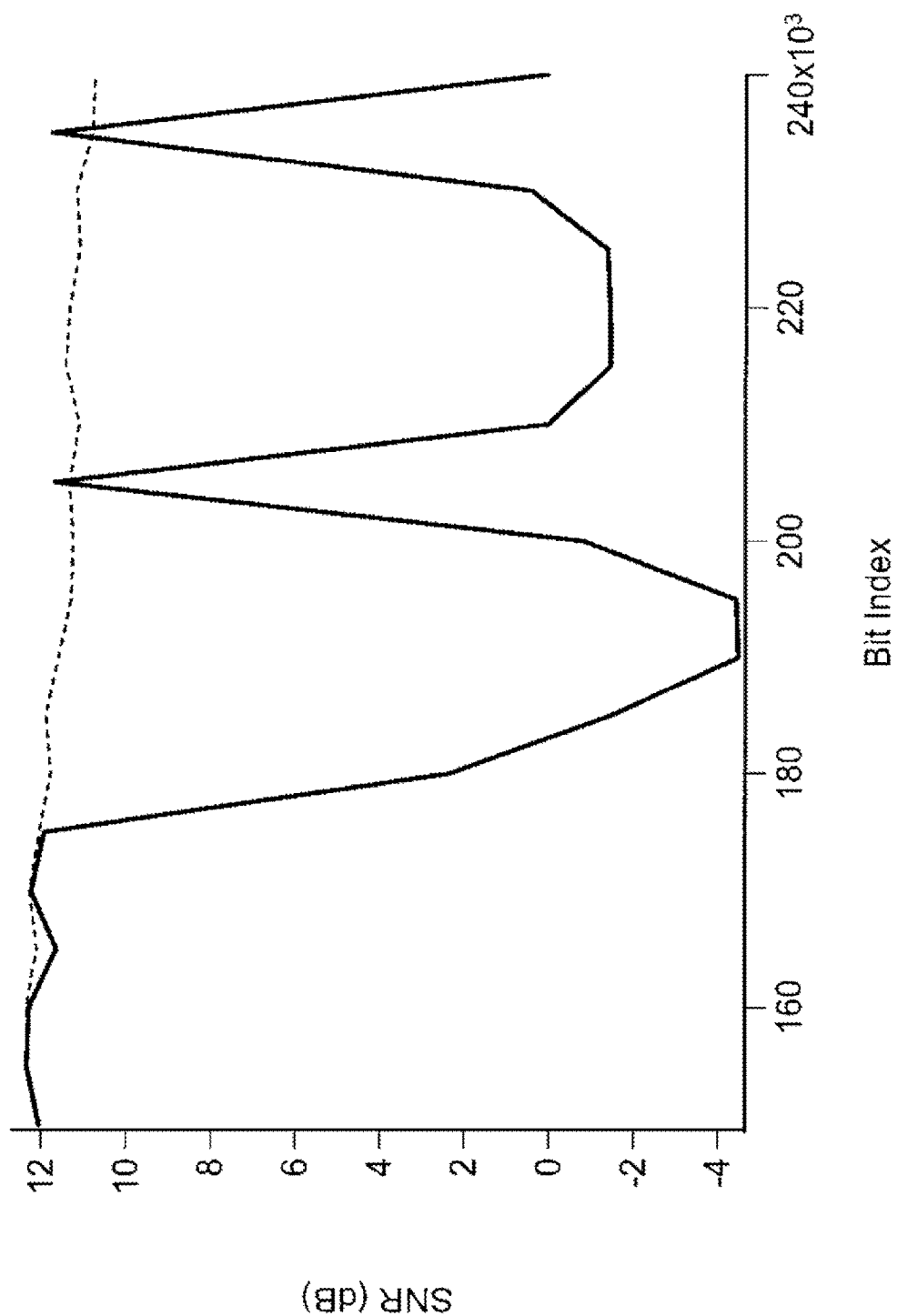
FIG. 9 is a graph showing an example of SNR against processed data length when probability $g_k$ indicated by Equation (4) is used (broken line), and of SNR against processed data length when probability $g_k$ is a fixed value (solid line)

FIGS. 7 and 9 show examples of SNR (broken line) against processed data length in a case in which probability $g_k$ indicated by Equation (4) is used, and of SNR (solid line) against processed data length when probability $g_k$ is a fixed value (here, as an example, "1"). In the example shown in FIG. 7, the SNR against processed data length in a case in which probability $g_k$ is a fixed value sharply decreases at a certain processed data length, while the SNR against processed data length in a case in which probability $g_k$ indicated by Equation (4) is used does not show any sharp decrease. Further, in the example shown in FIG. 9, the SNR against processed data length in a case in which probability $g_k$ is a fixed value fluctuates erratically several times, while the SNR against processed data length in a case in which probability $g_k$ indicated by Equation (4) is used is stable.

Figure 8:
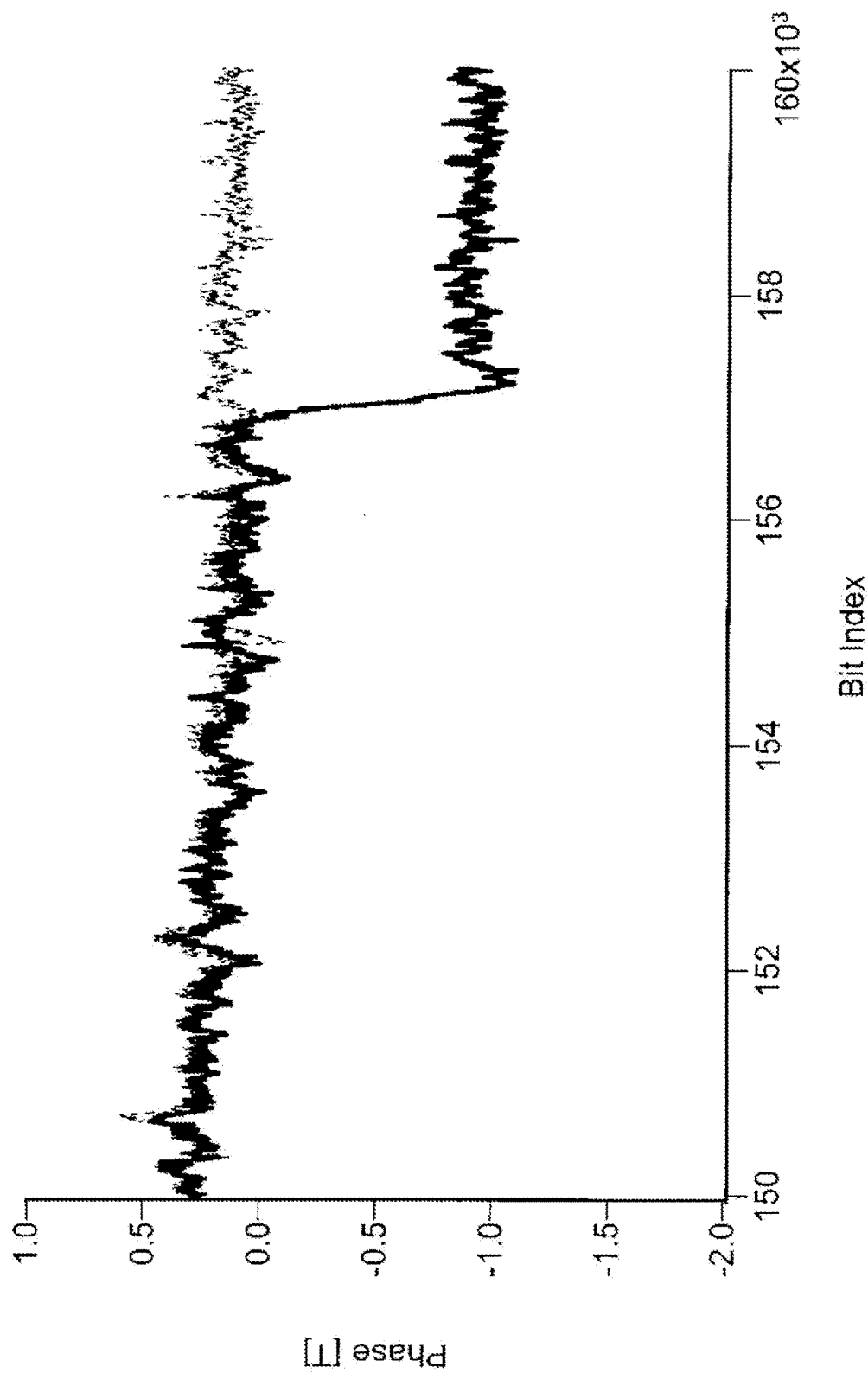
FIG. 8 is a graph showing an example of phase error against processed data length when probability $g_k$ indicated by Equation (4) is used (broken line), and of phase error against processed data length when probability $g_k$ is a fixed value (solid line)
Figure 10:
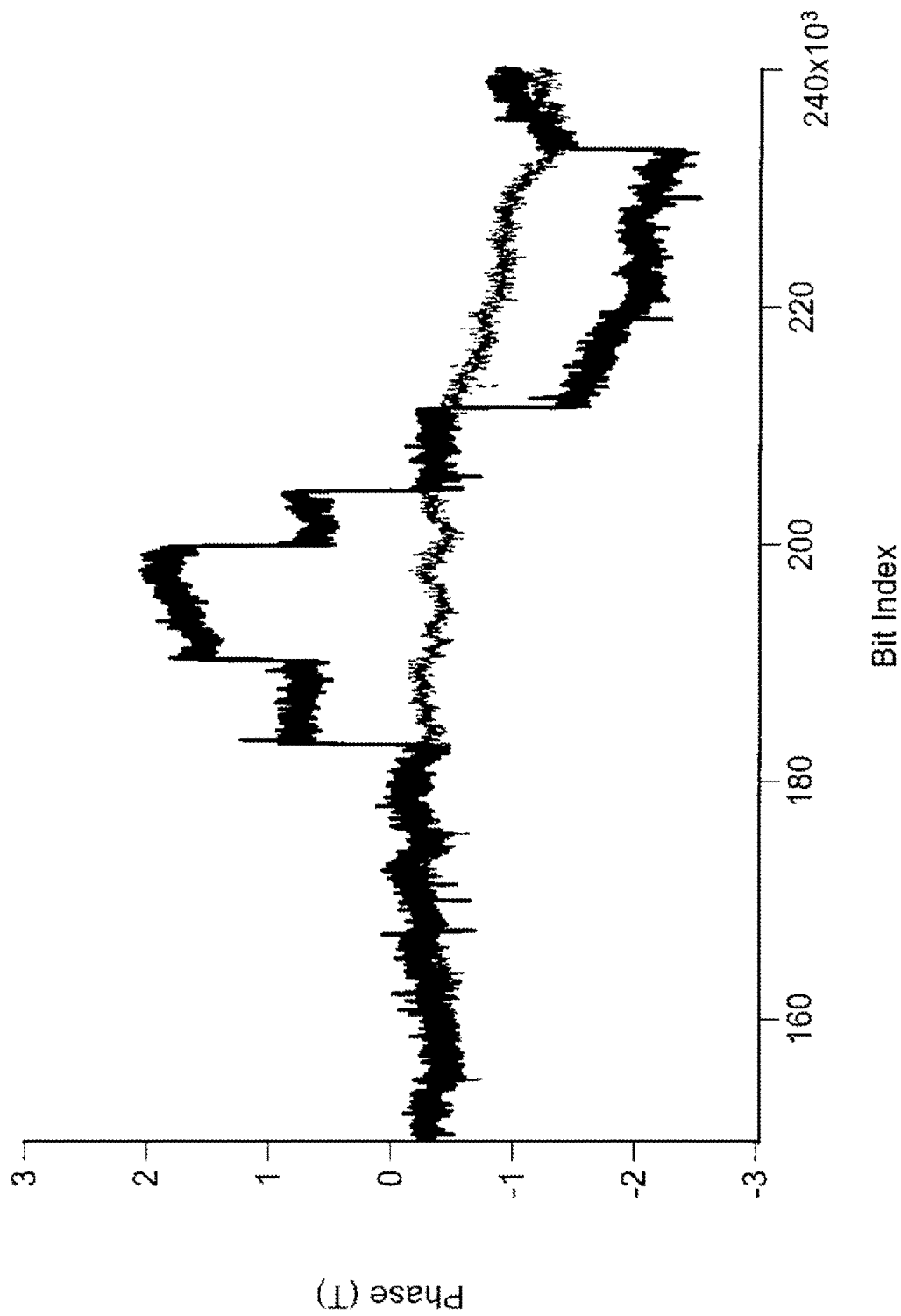
FIG. 10 is a graph showing an example of phase error against processed data length when probability $g_k$ indicated by Equation (4) is used (broken line), and of phase error against processed data length when probability $g_k$ is a fixed value (solid line)

FIGS. 8 and 10 show examples of phase error (broken line) against processed data length in a case in which probability $g_k$ indicated by Equation (4) is used, and of phase error (solid line) against processed data length in a case in which probability $g_k$ is a fixed value (here, as an example, "1"). In the example shown in FIG. 8, the phase error against processed data length in a case in which probability $g_k$ is a fixed value sharply increases at a certain processed data length and is then fixed, while the phase error against processed data length in a case in which probability $g_k$ indicated by Equation (4) is used does not show any sharp increase. Further, in the example shown in FIG. 10, the phase error against processed data length in a case in which probability $g_k$ is a fixed value fluctuates erratically several times, while the phase error against processed data length in a case in which probability $g_k$ indicated by Equation (4) is used is stable.

In this way, in a case in which probability $g_k$ is a fixed value, in a case in which jitter occurs, the sampling operation by sampling circuit 18 is not stable, the time of sampling deviates, and the deviation becomes fixed. In contrast, in a case in which probability $g_k$ indicated by Equation (4) is used, even if jitter occurs, deviation in the time of sampling is instantly corrected. This is because a probability $g_k$ is used that varies from moment to moment in accordance with the maximum likelihood path metric and the second most likely path metric, and because the reliability of the time adjustment value in a case in which probability $g_k$ indicated by Equation (4) is used is higher than the reliability of the time adjustment value in a case in which probability $g_k$ is a fixed value.

As explained in the foregoing, in magnetic information playback device 10, a candidate for the decoding result of the decoding target signal is estimated by the maximum likelihood decoding, and the maximum likelihood decoding result is detected, by detection section 20. Further, the time of sampling of the decoding target signal is adjusted, using the likelihood of the candidate for the decoding result estimated by detection section 20, by adjustment value calculation circuit 24. Therefore, compared to the first conventional technique and the second conventional technique, magnetic information playback device 10 is able to balance high precision sampling of a specific decoding target signal with suppression of delays that occur in order to adjust the time of sampling.

Further, in magnetic information playback device 10, decoding section 20 includes Viterbi detector 28 and error correction circuit 30, and the time of sampling is adjusted using the likelihood of the candidate for the decoding result estimated by Viterbi detector 28. Therefore, magnetic information playback device 10 can suppress delays that occur in order to adjust the time of sampling as compared to a case in which the time of sampling is adjusted based on the output from error correction circuit 30.

Further, in magnetic information playback device 10, adjustment of the time of sampling is initiated on the condition that an amount of time, which has been determined in advance as the permissible upper limit time for deviation in the time of sampling, has elapsed from the beginning of the sampling of the decoding target signal. Therefore, magnetic information playback device 10 can increase the reliability of the time of sampling as compared to a case in which adjustment of the time of sampling is performed before an amount of time, which has been determined in advance as the permissible upper limit time for deviation in the time of sampling, has elapsed from the beginning of the sampling of the decoding target signal.

Further, in magnetic information playback device 10, each time the decoding target single is sampled after an amount of time, which has been determined in advance as the permissible upper limit time for deviation in the time of sampling, has elapsed from the beginning of the sampling, a likelihood is calculated based on the sampled decoding target signal. Further, each time a likelihood is calculated, the time of sampling is adjusted using the calculated likelihood. Therefore, magnetic information playback device 10 can ensure high reliability with respect to the time of sampling even if the decoding target signal has fluctuated, as compared to a case in which adjustment of the time of sampling is performed only once using the first likelihood calculated after an amount of time, which has been determined in advance as the permissible upper limit time for deviation in the time of sampling, has elapsed from the beginning of the sampling.

Further, in magnetic information playback device 10, regardless of whether or not the maximum likelihood decoding result has been detected by detection section 20, each time a decoding target signal is sampled, a likelihood is calculated based on the sampled decoding target signal. Further, each time a likelihood is calculated, the time of sampling is adjusted using the calculated likelihood. Therefore, magnetic information playback device 10 can suppress delays that occur in order to adjust the time of the sampling, as compared to a case in which the time of the sampling is adjusted after waiting for the maximum likelihood decoding result to be detected by detection section 20.

Further, in magnetic information playback device 10, the lower the likelihood calculated at adjustment value calculation circuit 24, the smaller the amount of adjustment of the time of the sampling. As a result, the occurrence of undesirable adjustment amounts due to erroneous determination at Viterbi detector 28 is suppressed. Therefore, magnetic information playback device 10 can increase the accuracy of adjustment of the time of sampling as compared to a case in which the adjustment amount of the time of the sampling is decided independently of the likelihood. Further, the higher the probability $g_k$, the lower the likelihood becomes.

Further, in magnetic information playback device 10, the likelihood is calculated using soft information generated based on the decoding target signal. Therefore, magnetic information playback device 10 can obtain a highly accurate likelihood, as compared to a case in which the likelihood is defined without using soft information.

Further, in magnetic information playback device 10, the likelihood is defined by a probability that the decoding result has been accurately detected by decoding section 20, and a probability calculated using the maximum likelihood path metric and the competing path metric is adopted as the probability that defines the likelihood. Therefore, magnetic information playback device 10 can obtain a highly accurate likelihood, as compared to a case in which the likelihood is only defined with the maximum likelihood path metric or the competing path metric.

Further, in magnetic information playback device 10, the time of the sampling is adjusted in accordance with a time adjustment value calculated using Equations (1) to (4). Therefore, magnetic information playback device 10 can adjust the time of the sampling with high accuracy, as compared to a case in which the time of the sampling is only adjusted with a phase error calculated using Equation (1).

Further, in magnetic information playback device 10, a maximum likelihood decoding according to a Viterbi algorithm is adopted as the maximum likelihood decoding used in the estimation of the candidate for the decoding result. Therefore, magnetic information playback device 10 can obtain high cost-effectiveness as compared to a case in which a maximum likelihood decoding according to an algorithm other than a Viterbi algorithm is adopted.

Further, in magnetic information playback device 10, magnetic information is read from magnetic tape 26. Therefore, compared to the first conventional technique and the second conventional technique, magnetic information playback device 10 is able to balance high accuracy sampling of a specific decoding target signal with suppression of delays that occur in order to adjust the time of sampling, even in a case in which there is localized occurrence of changes in the conveyance speed of magnetic tape 26.

Figure 11:
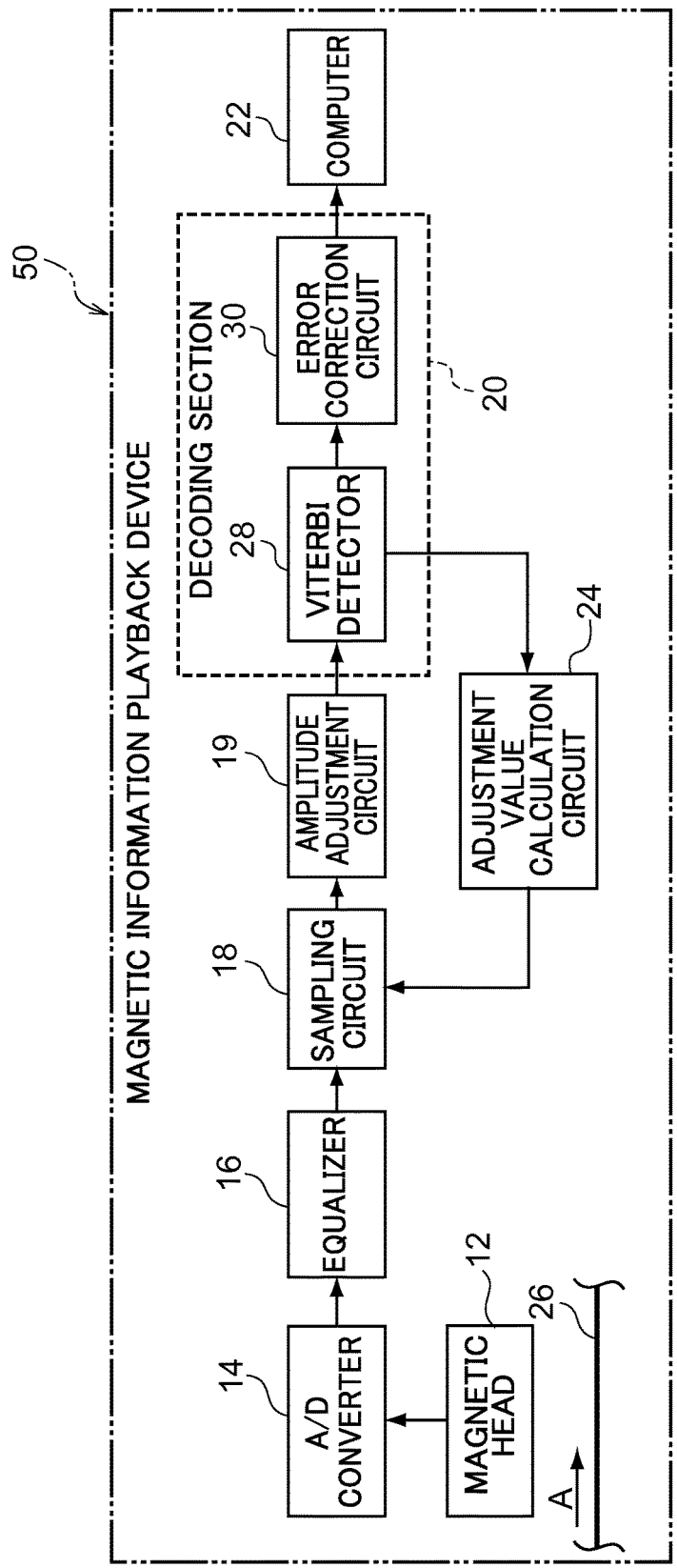
FIG. 11 is a block diagram showing a variant example of the main components of a magnetic information playback device according to an embodiment.

In the above-described embodiment, a magnetic information playback device 10 has been exemplified that has Viterbi detector 28, into which a decoding target signal is directly input from sampling circuit 18; however, the technique of the present disclosure is not limited thereto. As shown in FIG. 11, for example, magnetic information playback device 50, in which amplitude adjustment circuit 19 is interposed between sampling circuit 18 and Viterbi detector 28, may be adopted.

An example of amplitude adjustment circuit 19 is an automatic gain controller (AGC). In amplitude adjustment circuit 19, the amplitude components of the decoding target signal output by sampling circuit 18 are adjusted. Then, in Viterbi detector 28, the candidate for the decoding result of the decoding target signal whose amplitude components have been adjusted by amplitude adjustment circuit 19 are estimated by the maximum likelihood decoding and the maximum likelihood decoding result is detected. Accordingly, magnetic information playback device 50 can increase the precision of detection of the maximum likelihood decoding result by Viterbi detector 28 as compared to a case in which the decoding target signal is directly input to Viterbi detector 28 from sampling circuit 18.

Further, in the above-described embodiment, a case is exemplified in which the time of the sampling is adjusted using the likelihood obtained from Viterbi detector 28; however, the time of the sampling may be adjusted using the likelihood of the candidate for an error correction result estimated in regard to correction of errors by the maximum likelihood decoding.

Figure 12:
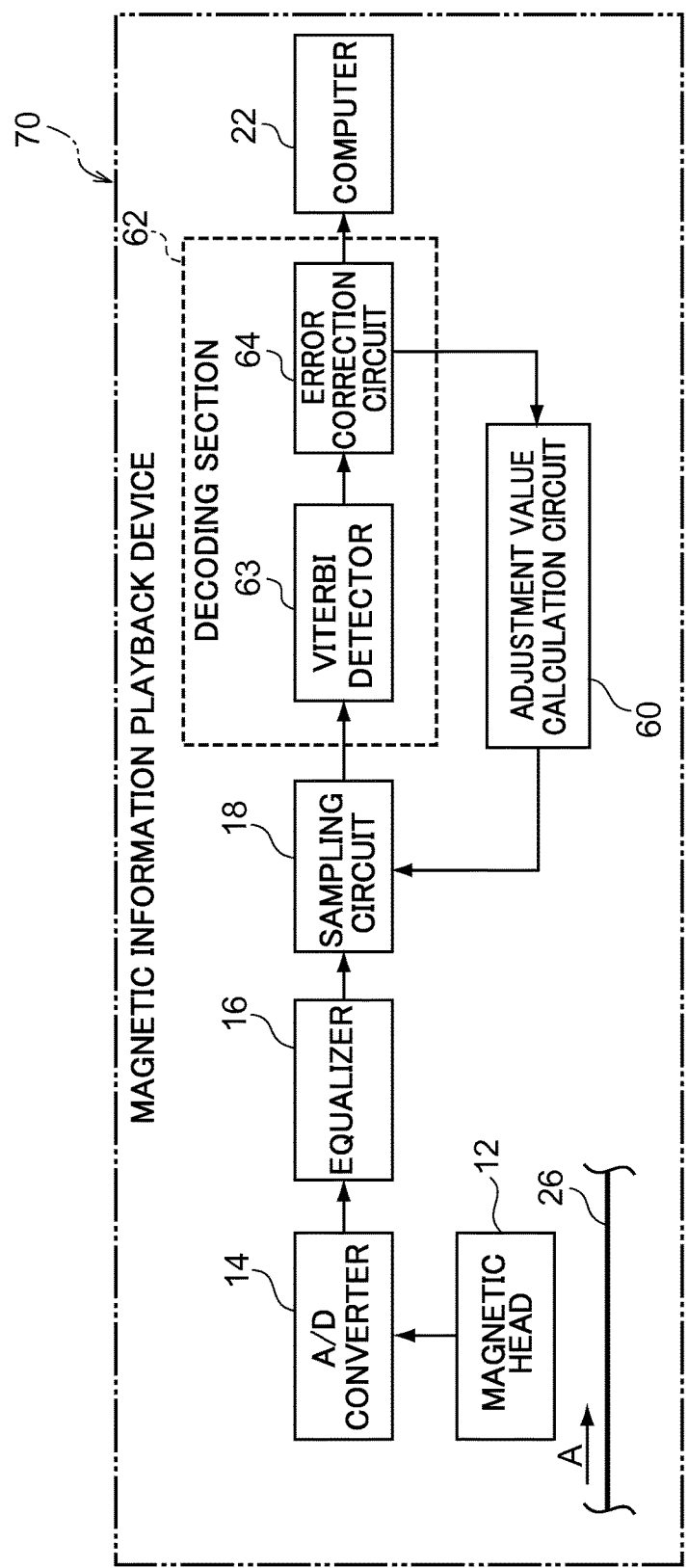
FIG. 12 is a block diagram showing a variant example of the main components of a magnetic information playback device according to an embodiment.

As shown in FIG. 12 as an example, magnetic information playback device 70 differs from magnetic information playback device 10 in terms of having adjustment value calculation circuit 60 instead of adjustment value calculation circuit 24 and having decoding section 62 instead of decoding section 20. Decoding section 62 differs from decoding section 20 in terms of having Viterbi detector 63 instead of Viterbi detector 28 and having error correction circuit 64 instead of error correction circuit 30.

Viterbi detector 63 outputs a Viterbi detection signal to error correction circuit 64 without outputting the decoding target signal, the provisional decoding target signal and the path metrics to adjustment value calculation circuit 60.

Using a maximum likelihood decoding, error correction circuit 64 estimates the candidate for an error correction result of the decoding result detected by Viterbi detector 63 and outputs the maximum likelihood error correction result, thereby correcting errors in the decoding result detected by Viterbi detector 63.

Error correction circuit 64 outputs, to adjustment value calculation circuit 60, the Viterbi detection signal, a provisional Viterbi detection signal which is an ideal Viterbi detection signal, and the path metrics constructed at error correction circuit 64. The signal level of the Viterbi detection signal corresponds to the signal level of the decoding target signal used for calculating the time adjustment value in the above-described embodiment. Further, the signal level of the provisional Viterbi detection signal corresponds to the signal level of the provisional decoding target signal used for calculating the time adjustment value in the above-described embodiment.

Adjustment value calculation circuit 60 calculates a time adjustment value, using Equations (1) to (4), from the Viterbi detection signal, the provisional Viterbi detection signal, and the path metrics input from error correction circuit 64, and outputs the calculated time adjustment value to sampling circuit 18.

Sampling circuit 18 adjusts the time of the sampling in accordance with the time adjustment value input from adjustment value calculation circuit 60 and samples the decoding target signal at the adjusted time.

Adjustment of the sampling by sampling circuit 18 and adjustment value calculation circuit 60 is initiated on the condition that the elapsed time from the beginning of sampling by sampling circuit 18 to the present time has exceeded a permissible upper limit time. That is, after a permissible upper limit time has elapsed from the beginning of sampling by sampling circuit 18, each time a decoding result is detected at Viterbi detector 63, adjustment value calculation circuit 60 calculates a likelihood, based on the decoding result detected at Viterbi detector 63, which is a likelihood of a candidate for an error correction result. Further, each time a likelihood is calculated, adjustment value calculation circuit 60 calculates a time adjustment value using the calculated likelihood and outputs the same to sampling circuit 18. An example of the upper limit time is a time that is determined in advance as a permissible time for jitter that occurs in conjunction with the conveyance of magnetic tape 26.

In this way, in magnetic information playback device 70, errors in the maximum likelihood decoding result are corrected as a result of the candidate for the error correction result of the decoding result being estimated by the maximum likelihood decoding, and the maximum likelihood error correction result being detected, by error correction circuit 64. Further, the time of the sampling of the decoding target signal is adjusted, using the likelihood of the candidate for the error correction result estimated at error correction circuit 64, by adjustment value calculation circuit 60. Therefore, compared to the first conventional technique and the second conventional technique, magnetic information playback device 70 is able to balance high accuracy sampling of a specific decoding target signal with suppression of delays that occur in order to adjust the time of sampling.

Further, an error correction circuit (latter-stage error correction circuit) having a function of estimating an error correction result by the maximum likelihood decoding may further be provided at a latter stage of error correction circuit 30, and the likelihood may be calculated using soft information obtained at the latter-stage error correction circuit.

Further, in the above-described embodiment, a case has been exemplified in which the likelihood is calculated based on the sampled decoding target signal each time sampling is performed after a time predetermined as a permissible upper limit time has elapsed from the beginning of the sampling; however, the technique of the present disclosure is not limited thereto. For example, the likelihood may be calculated based on the sampled decoding target signal each time sampling is performed before a time predetermined as a permissible upper limit time has elapsed from the beginning of the sampling. In such a case, the time of sampling is adjusted using the calculated likelihood each time the likelihood is calculated. As a result, magnetic information playback device 10 can suppress reductions in the accuracy of adjustment of the time of sampling accompanying fluctuations in the decoding target signal, as compared to a case in which adjustment of the time of sampling using the likelihood is performed only once.

Further, in the above-described embodiment, an EPR4 transmission route has been exemplified; however, the technique of the present disclosure is not limited thereto, and other transmission routes such as a PR4 (Partial Response class-4) transmission route or a GPR (Generalized Partial Response) transmission route may be adopted.

Further, in the above-described embodiment, a Viterbi algorithm has been exemplified; however, the technique of the present disclosure is not limited thereto, and other algorithms for maximum likelihood decoding such as an FDTS (Fixed-depth tree search) algorithm, a Fano algorithm or a stack algorithm may be used.

Further, in the above-described embodiment, sampling circuit 18 and adjustment value calculation circuit 24 are provided as separate entities; however, the technique of the present disclosure is not limited thereto, and sampling circuit 18 and adjustment value calculation circuit 24 may be integrated.

Further, in the above-described embodiment, a case has been exemplified in which magnetic information is read from magnetic tape 26; however, the technique of the present disclosure is not limited thereto. For example, a case in which magnetic information is read out from a magnetic disk may also be applied to the technique of the present disclosure.

Further, in the above-described embodiment, a case has been exemplified in which the time of sampling of the decoding target signal is adjusted by sampling circuit 18, decoding section 20 and adjustment value calculation circuit 24; however, the technique of the present disclosure is not limited thereto and existing techniques may be combined with the technique of the present disclosure.

For example, with respect to an existing technique (referred to below as "existing technique A") in which the phase of a signal input at the input stage of a phase adjustment circuit is adjusted by feeding back the output of a decoder to the input stage of the phase adjustment circuit, and optimal feedback corresponding to a decoded pattern is enabled by installing independent phase adjustment circuits for each possible decoding pattern, the principal function of adjusting the time of sampling of the decoding target signal by sampling circuit 18, decoding section 20 and adjustment value calculation circuit 24 (referred to below as "the principal function according to the present embodiment") may be incorporated. Further, with respect to an existing technique (referred to below as "existing technique B") in which feedback delays can be minimized by optimizing the gain parameters of a phase adjustment circuit even in a system in which feedback delays are present at the input stage of the phase adjustment circuit, the principal function according to the present embodiment may be incorporated. Further, with respect to an existing technique (referred to below as "existing technique C") in which resistance to jitter is improved by using information on speed fluctuations obtained from the playback signals of other channels rather than the signal of a single channel, since plural channels are simultaneously influenced by speed fluctuations in a tape system, the principal function according to the present embodiment may be incorporated. Further, the principal function according to the present embodiment may be incorporated with respect to a combination of existing technique A, existing technique B and existing technique C, or the principal function according to the present embodiment may be incorporated with respect to a combination of two of existing technique A, existing technique B and existing technique C. Even greater effects can be expected by combining the technique of the present disclosure with existing techniques in this way.

In the above-described embodiment, a method of calculating probability $g_k$ by Equation (6) has been exemplified; however, the technique of the present disclosure is not limited thereto. While probability $g_k$ can be an indicator of the accuracy of the decoding determination, an example of more exact calculation of the probability that an accurate determination has been made is provided below.

First, probability $g_k$ as established by Equation (6) is denoted as probability $p_k$. Next, it is possible to statistically calculate probability $g_k$ of performing an accurate determination with the bits at the time that each probability $p_k$ was obtained, by making the value of probability $p_k$ for each bit defined by Equations (4) to (6) using a known signal in advance (a signal obtained from a different determination method that can determine whether or not an accurate determination was made), correspond with the correctness or incorrectness of the determination in these bits. By confirming the correlation between probability $p_k$ and probability $g_k$ by advance calibration processing or the like and by creating a pre-conversion table, it becomes possible to calculate probability $g_k$ from probability $p_k$ as a statistical probability rather than as an indicator of mere likelihood. Examples of methods for calculating probability $p_k$ include methods using Equations (4) to (6) and the methods indicated below.

In the above-described embodiment, in a case in which calculating the probability $g_k$ of accurately detecting the decoding result, the value of the path metric of a favorite path (maximum likelihood path metric) and of the path metric of a competing path (competing path metric) are used; however, the technique of the present disclosure is not limited thereto and it is possible to determine the probability even more precisely.

Probability $g_k$ as explained in the above-described embodiment is one indicator (=probability $p_k$) that expresses a maximum likelihood as has been discussed above and, in the example shown in Equation (6), the probability of the favorite path with respect to all other competing paths is expressed. Further, among the competing paths at this time, while the newest bits differ from the favorite path, if a given fixed delay is retraced, there exist those that converge in the same path. Further, despite being a different path, there may be cases when the bit determination ("0" or "1") at the time of retracing by only the extent of a fixed delay was, in effect, the same as the favorite path. What is actually at issue is (i) that the determination is either "0" or "1" at the time of the pre-defined delay bit (past), and (ii) the extent of the probability that the determination of "0" or "1" at this time is accurate.

In the above-described embodiment, as regards the above-described (i) and (ii), the following methods are kept in mind, respectively.

Regarding the above-described (i), at a time at which a permissible time (bit) has elapsed, a path having the smallest path metric is selected as the correct path and timing adjustment is performed using previous decoding results of that path to the extent of the delay bit. Regarding the above-described (ii), probability $g_k$ is calculated using the value of the path metric of a candidate for the correct path selected as described above and of other competing paths.

Further, the following methods are effective for accurately estimating the above-described (i) and (ii).

Regarding all the paths, including the favorite path and the competing paths, determination is made using the following Equations (7) and (8) and likelihood (probability) $p_k$ is calculated, using the decoding results "0" and "1" of previous times to the extent of the pre-defined bit (delay bit) in each of the paths and using the values of the path metrics of each of the paths (for example, the current path metrics). That is, a comparison is implemented by comparison not of the favorite path and the competing paths, but by comparison of paths for which the decoding result was "0" and paths for which the decoding result was "1" at a time that was a defined bit previously.

Equation (7)

$$p_k^{A=0} \equiv \frac{\sum_i e^{-M_i^{a=0}}}{\sum_i e^{-M_i^{a=0}} + \sum_i e^{-M_i^{a=1}}} \quad (7)$$

Equation (8)

$$p_k^{A=1} \equiv \frac{\sum_i e^{-M_i^{a=1}}}{\sum_i e^{-M_i^{a=0}} + \sum_i e^{-M_i^{a=1}}} \quad (8)$$

In Equations (7) and (8), "a" is the decoding result at a time the pre-defined amount of delay bits previously for each path, and "A" is the final decoding result determined on the basis of this information. Here, the likelihood (probability) of A=0 and A=1 is respectively set as $P_k^{A=0}$ and $P_k^{A=1}$, and the path metrics of each path having a=0 and a=1 are respectively set as $M^{a=0}$ and $M^{a=1}$.

Further, in accordance with the magnitude correlation of $P_k^{A=0}$ and $P_k^{A=1}$, a provisional determination result used in the detection of phase error is determined in accordance with the following Inequality (9) and Inequality (10).

Inequality (9):

In a case in which $P_k^{A=0} \geq P_k^{A=1}$, $A=0$ \quad (9)

Inequality (10):

In a case in which $P_k^{A=0} \leq P_k^{A=1}$, $A=1$ \quad (10)

As per the foregoing, by performing determination and likelihood calculation in consideration of the path metrics of all the paths including the favorite path and the competing paths and of the decoding results of "0" and "1" in the respective paths, the reliability of the determination can be improved and a more accurate likelihood can be calculated, as compared to a method that determines the result of only the favorite path.

In the above-described embodiment, a case has been exemplified of using Viterbi algorithms and the values of path metrics that are used in calculations within Viterbi algorithms in order to obtain the decoding results of "0" and "1" and the likelihood of the decoding results; however, the technique of the present disclosure is not limited thereto. For example, a BCJR (Bahl, Cocke, Jelinek, Raviv) algorithm may be used as a means for obtaining soft information. Incidentally, a BCJR algorithm is also referred to as a MAP algorithm or a sum-product algorithm (refer to Bahl, J. Cocke, F. Jelinek, and J. Raviv, "Optimal Decoding of Linear Codes for Minimizing Symbol Error Rate", IEEE Transactions on Information Theory, Vol. IT-20 (2), pp. 284-287, March 1974, or to <http://www.ieice-hbkb.org/files/01/01gun_02hen_05.pdf>).

While the Viterbi algorithm is intended for selection of the maximum likelihood path (the path metric being an indicator for this purpose), the BCJR algorithm is intended for quantification of the plausibility of "0" or "1" for each bit calculated from the path metrics of all paths that exist at a given time. As a result, in the Viterbi algorithm, only one path is selected in a case in which two competing paths intersect and information (the path metric) regarding the path that was not selected at this time is lost; however, in the BCJR algorithm, the values of the path metrics for basically all of the paths are stored.

Since a normal BCJR algorithm uses all of one sector's worth of data (normally about 8,000 bits of data) when calculating likelihood, there is a constraint in that processing cannot begin until one sector's worth of data is available. Therefore, while lacking in the immediacy of determination that is important in the technique of the present disclosure and in superiority as related to buffer memory, a Sliding-window BCJR algorithm (refer to Benedetto, S., et al., "Soft-output decoding algorithms in iterative decoding of turbo codes", TDA Progress Report 42, 1996, 124: 63-87, or to <http://tmo.jpl.nasa.gov/progress_report/42-124G.pdf>) and a Soft-output Viterbi (SOVA) algorithm (refer to Hagenauer, Joachim; Hoeher, Peter, "A Viterbi algorithm with soft-decision outputs and its applications", in: Global Telecommunications Conference and Exhibition, "Communications Technology for the 1990s and Beyond" (Globecom), 1989, IEEE, pp. 1680-1686, <http://www.ece.lehigh.edu/~jingli/teach/S2003turbo/notes/SOVA.pdf> or <http://www.ieice-hbkb.org/files/01/01gun_02hen_05.pdf>) have been developed, which address this issue.

The Sliding-window BCJR algorithm, with respect to a normal BCJR algorithm, is a simplified BCJR algorithm that is performed within a defined delay bit window, and while it is only necessary to store a prescribed amount of delay bits' worth of path metrics, the Sliding-window BCJR algorithm is more reliable than the Viterbi algorithm in terms of the calculation of the likelihood of each bit.

The SOVA algorithm has been developed from the Viterbi algorithm, and is configured such that, by storing, rather than discarding, information on the difference (=likelihood) between the path metrics of both paths in a case in which two competing paths intersect, the information can subsequently be used in the calculation of the likelihood of the bit determination thereof. As compared to the BCJR algorithm, which uses information (path metrics) on the newest input bits, retraces to the past, and is also reflected in the calculation of the likelihood of previous bits, and the Sliding-window BCJR algorithm, the SOVA algorithm has the advantage that the load in terms of circuit implementation is lower than the Sliding-window BCJR algorithm because, similarly to a normal Viterbi algorithm, input data is processed sequentially (there is no updating of the likelihood of previous bits that have already been established, based on subsequently input data).

Further, as regards the calculation of probability $P_k$ for each bit, by using the Sliding-window BCJR algorithm and the SOVA algorithm, more reliable calculation of the likelihood becomes possible and a more appropriate value can be selected as the gain (probability of accurate determination) $g_k$ at the time of phase adjustment.

All documents, patent applications and technical specifications recited in this specification are incorporated herein by reference in this specification to the same extent as if each individual publication, patent application and technical standard was specifically and individually indicated to be incorporated by reference.

What is claimed is:

1. A signal processing device, comprising:
an extraction section that extracts, from an input digital signal, a decoding target signal at an extraction timing that has been determined as a timing for extracting the decoding target signal;
a decoding section that decodes the decoding target signal by estimating, by a maximum likelihood decoding, a candidate for a decoding result of the decoding target signal extracted by the extraction section and by detecting a maximum likelihood decoding result; and
an adjustment section that adjusts the extraction timing using a likelihood of the candidate for the decoding result estimated by the decoding section,
wherein adjustment of the extraction timing by the adjustment section is initiated on a condition that a predetermined time, which is an upper limit time in which deviations in the extraction timing are permissible, has elapsed from initiation of extraction of the decoding target signal by the extraction section, and
wherein the adjustment section calculates the likelihood based on the extracted decoding target signal each time the decoding target signal is extracted by the extraction section, and adjusts the extraction timing using the calculated likelihood each time the likelihood is calculated.

2. The signal processing device of claim 1, wherein the decoding section comprises:
a detection section that estimates the candidate by the maximum likelihood decoding and detects the maximum likelihood decoding result; and
a correction section that corrects errors in the maximum likelihood decoding result detected by the detection section.

3. The signal processing device of claim 1, wherein, after the predetermined time has elapsed from initiation of extraction of the decoding target signal by the extraction section, the adjustment section calculates the likelihood based on the extracted decoding target signal each time the decoding target signal is extracted by the extraction section, and adjusts the extraction timing using the calculated likelihood each time the likelihood is calculated.

4. The signal processing device of claim 3, wherein, irrespective of whether or not a maximum likelihood decoding result has been detected by the decoding section, the adjustment section calculates the likelihood based on the extracted decoding target signal each time the decoding target signal is extracted by the extraction section, and adjusts the extraction timing using the calculated likelihood each time the likelihood is calculated.

5. The signal processing device of claim 1, wherein, the lower the likelihood, the more the adjustment section reduces an adjustment amount of the extraction timing.

6. The signal processing device of claim 1, wherein the likelihood is calculated using soft information generated based on the decoding target signal.

7. The signal processing device of claim 6, wherein:
the soft information comprises a maximum likelihood path metric and a competing path metric;
the likelihood is defined by a probability that the decoding result is accurately detected by the decoding section; and
the probability is calculated using the maximum likelihood path metric and the competing path metric.

8. The signal processing device of claim 7, wherein the adjustment section adjusts the extraction timing using an adjustment amount $\tau_{k-1}$ that is obtained using the following Equation (1), Equation (2) and Equation (3):

$$\epsilon_k = y_k d_{k-1} - y_{k-1} d_k \qquad \text{Equation (1):}$$

$$\theta_k = \theta_{k-1} + g_k \beta \epsilon_k \qquad \text{Equation (2):}$$

$$\tau_{k+1} = \tau_k + g_k \alpha \epsilon_k + \theta_k \qquad \text{Equation (3):}$$

wherein, in Equation (1), Equation (2) and Equation (3), k is a natural number; $\epsilon$ is a phase error between the decoding target signal and an ideal decoding target signal; y is a signal level of the decoding target signal; d is a signal level of the ideal decoding target signal; $\tau$ is an adjustment amount of the extraction timing; g is the probability; $\theta$ is a derivative term of an error in the extraction timing; and $\alpha$ and $\beta$ are adjustment items.

9. The signal processing device of claim 1, wherein the maximum likelihood decoding is a maximum likelihood decoding according to a Viterbi algorithm.

10. The signal processing device of claim 1, further comprising an amplitude component adjustment section that adjusts an amplitude component of the decoding target signal, wherein the decoding section estimates, by the maximum likelihood decoding, the candidate for the decoding result of the decoding target signal, the amplitude component of which has been adjusted by the amplitude component adjustment section, and detects the maximum likelihood decoding result.

11. A magnetic information playback device, comprising:
a reading head that reads magnetic information from a magnetic recording medium;
a generation section that generates a digital signal from the magnetic information that has been read by the reading head; and
the signal processing device of claim 1, to which the digital signal generated by the generating section is input.

12. The magnetic information playback device of claim 11, wherein the magnetic recording medium is a magnetic tape.

13. The magnetic information playback device of claim 12, wherein adjustment of the extraction timing by the adjustment section included in the signal processing device is initiated on a condition that a predetermined time, which is a permissible time for jitter that occurs in conjunction with conveyance of the magnetic tape, has elapsed from initiation of extraction of the decoding target signal by the extraction section included in the signal processing device.

14. A signal processing method, comprising:
- extracting, from an input digital signal, a decoding target signal at an extraction timing that has been determined as a timing for extracting the decoding target signal;
- decoding the decoding target signal by estimating, by a maximum likelihood decoding, a candidate for a decoding result of the extracted decoding target signal and detecting a maximum likelihood decoding result; and
- adjusting the extraction timing using a likelihood of the estimated candidate for the decoding result,
- wherein adjusting the extraction timing is initiated on a condition that a predetermined time, which is an upper limit time in which deviations in the extraction timing are permissible, has elapsed from initiation of extraction of the decoding target signal by the extraction section, and
- wherein the likelihood is calculated based on the extracted decoding target signal each time the decoding target signal is extracted by the extraction section, and extraction timing is adjusted using the calculated likelihood each time the likelihood is calculated.

* * * * *